(12) United States Patent
Kwak

(10) Patent No.: US 11,264,408 B2
(45) Date of Patent: Mar. 1, 2022

(54) ARRAY SUBSTRATE AND ORGANIC LIGHT-EMITTING DISPLAY INCLUDING THE SAME

(71) Applicant: SAMSUNG DISPLAY CO., LTD., Yongin-si (KR)

(72) Inventor: Won Kyu Kwak, Seongnam-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/749,690

(22) Filed: Jan. 22, 2020

(65) Prior Publication Data
US 2020/0161344 A1 May 21, 2020

Related U.S. Application Data

(60) Continuation of application No. 15/829,613, filed on Dec. 1, 2017, now Pat. No. 10,553,619, which is a (Continued)

(30) Foreign Application Priority Data

Jun. 17, 2013 (KR) .......................... 10-2013-0069039
Oct. 21, 2013 (KR) .......................... 10-2013-0125416

(51) Int. Cl.
*H01L 23/00* (2006.01)
*H01L 27/32* (2006.01)
*H01L 27/12* (2006.01)

(52) U.S. Cl.
CPC ........ *H01L 27/1244* (2013.01); *H01L 23/562* (2013.01); *H01L 27/124* (2013.01); (Continued)

(58) Field of Classification Search
CPC . H01L 27/1244; H01L 27/124; H01L 23/562; H01L 27/3276; H01L 27/1218;
(Continued)

(56) References Cited

U.S. PATENT DOCUMENTS

| 7,566,633 B2 | 7/2009 | Koyama et al. |
| 7,939,913 B2 | 5/2011 | Watanabe et al. |

(Continued)

FOREIGN PATENT DOCUMENTS

| CN | 1612344 | 5/2005 |
| CN | 1832179 | 9/2006 |

(Continued)

OTHER PUBLICATIONS

Korean Office Action dated Aug. 30, 2019.
(Continued)

*Primary Examiner* — Cuong B Nguyen
(74) *Attorney, Agent, or Firm* — F. Chau & Associates, LLC

(57) ABSTRACT

An array substrate includes a substrate, a barrier layer disposed on the substrate, a buffer layer disposed on the barrier layer, a first insulating layer disposed on the buffer layer, a second insulating layer disposed on the first insulating layer, a plurality of wiring patterns disposed between the first insulating layer and the second insulating layer and/or on the second insulating layer. In addition, the wiring patterns are separated from each other, and extend toward a side of the substrate. The array substrate further includes a recess pattern disposed adjacent the wiring patterns and recessed from a top surface of the second insulating layer to expose at least part of a top surface of the substrate, and an organic insulating layer disposed on the second insulating layer and exposing at least part of a portion of the top surface of the substrate which is exposed by the recess pattern.

21 Claims, 28 Drawing Sheets

Related U.S. Application Data division of application No. 15/273,478, filed on Sep. 22, 2016, now abandoned, which is a continuation of application No. 14/264,228, filed on Apr. 29, 2014, now Pat. No. 9,472,507.

(52) U.S. Cl.
CPC ...... *H01L 27/1218* (2013.01); *H01L 27/3276* (2013.01); *H01L 2251/5338* (2013.01); *H01L 2924/00* (2013.01); *H01L 2924/0002* (2013.01)

(58) Field of Classification Search
CPC ......... H01L 2924/00; H01L 2924/0002; H01L 2251/5338; H01L 23/13; H01L 23/145; H01L 51/5246; H01L 27/32–326; H01L 51/50–5012; H01L 51/525–5287; H01L 2227/32–326; H01L 2251/5323–5361; H01L 2924/12044
See application file for complete search history.

(56) References Cited

U.S. PATENT DOCUMENTS

| | | | |
|---|---|---|---|
| 7,957,151 | B2 | 6/2011 | Aita et al. |
| 8,143,153 | B2 | 3/2012 | Watanabe et al. |
| 8,937,007 | B2 | 1/2015 | Watanabe et al. |
| 9,472,507 | B2 | 10/2016 | Kwak |
| 2002/0030658 | A1 | 3/2002 | Kim et al. |
| 2002/0109811 | A1 | 8/2002 | Park et al. |
| 2002/0117719 | A1 | 8/2002 | Ando et al. |
| 2002/0122143 | A1 | 9/2002 | Woo et al. |
| 2004/0012744 | A1 | 1/2004 | Ishige et al. |
| 2004/0125314 | A1 | 7/2004 | Choi |
| 2004/0126942 | A1 | 7/2004 | Park et al. |
| 2005/0087742 | A1 | 4/2005 | Chang et al. |
| 2005/0116292 | A1 | 6/2005 | Koo et al. |
| 2005/0184927 | A1 | 8/2005 | Kwak |
| 2006/0202206 | A1 | 9/2006 | Koyama et al. |
| 2007/0052878 | A1* | 3/2007 | Song .................. G02F 1/136259 349/54 |
| 2007/0090420 | A1 | 4/2007 | Chu et al. |
| 2010/0317156 | A1 | 12/2010 | Tsurume et al. |
| 2011/0127500 | A1 | 6/2011 | Ko et al. |
| 2011/0249228 | A1 | 10/2011 | Kubota et al. |
| 2014/0134763 | A1 | 5/2014 | Park et al. |
| 2014/0367658 | A1 | 12/2014 | Kwak |
| 2017/0012063 | A1 | 1/2017 | Kwak |
| 2018/0090520 | A1 | 3/2018 | Kwak |

FOREIGN PATENT DOCUMENTS

| | | |
|---|---|---|
| EP | 2 323 466 | 5/2011 |
| JP | 7-17059 | 4/1995 |
| JP | 2002252353 | 9/2002 |
| JP | 2006106106 | 4/2006 |
| JP | 2006270077 | 10/2006 |
| JP | 2009-021213 | 1/2009 |
| KR | 1999-012579 | 2/1999 |
| KR | 1020010098078 | 11/2001 |
| KR | 2003-0042079 | 5/2003 |
| KR | 10-2005-0038850 | 4/2005 |
| KR | 10-2005-0082260 | 8/2005 |
| KR | 1020090045536 | 5/2009 |
| KR | 1020090121894 | 11/2009 |
| KR | 10-2011-0030685 | 3/2011 |
| KR | 10-2012-0023897 | 3/2012 |
| WO | WO2007-063667 | 6/2007 |
| WO | WO2008-126268 | 7/2010 |
| WO | 2012164882 | 12/2012 |
| WO | 2014/126403 | 8/2014 |

OTHER PUBLICATIONS

Japanese Office Action dated Jul. 3, 2016 For Japanese Patent Application No. 2014-122154.
Office Action dated Sep. 13, 2017 For Chinese Patent Application No. 201410264304.9 Filed Jun. 13, 2014.
Chinese Office Action dated Mar. 1, 2017.
Chinese Office Action dated Mar. 1, 2017 _English Version.
European Office Action dated Feb. 5, 2015.
Tiawanese Office Action dated Nov. 17, 2017 for Application No. 103120940.

* cited by examiner

ARRAY SUBSTRATE AND ORGANIC LIGHT-EMITTING DISPLAY INCLUDING THE SAME

This application is a Continuation of co-pending U.S. patent application Ser. No. 15/829,613, filed on Dec. 1, 2017, which is a Division of U.S. patent application Ser. No. 15/273,478, filed on Sep. 22, 2016, which is a Continuation of U.S. patent application Ser. No. 14/264,228, filed on Apr. 29, 2014, which claims priority to Korean Patent Application No. 10-2013-0069039 filed on Jun. 17, 2013 and Korean Patent Application No. 10-2013-0125416 filed on Oct. 21, 2013, the disclosures of which are hereby incorporated by reference herein in their entireties.

BACKGROUND OF THE INVENTION

1. Technical Field

The present disclosure relates to an array substrate and a display device including the same, and more particularly, to an array substrate having a display area and a non-display area and a display device including the array substrate.

2. Discussion of the Related Art

A display device such as a liquid crystal display (LCD) or an organic light-emitting display (OLED) may include an array substrate having a display area and a non-display area located outside the display area. Such a display device may include a plurality of pixels in the display area as basic elements for displaying an image, and each of the pixels may include a switching device to operate independently.

In LCDs or OLEDs, the array substrate is used as a circuit board for driving each pixel independently. Gate wirings delivering scan signals, data wirings delivering image signals, thin-film transistors (TFTs), and various organic or inorganic insulating layers are disposed on the array substrate. Of these elements, each of the TFTs includes a gate electrode which is a portion of a gate wiring, a semiconductor layer which forms a channel, a source electrode which is a portion of a data wiring, and a drain electrode. Therefore, each of the TFTs may serve as a switching device.

In the non-display area located outside the display area, a plurality of wirings connected to gate lines or data lines of the display area are disposed. The wirings may extend in various forms and may have respective ends connected to a plurality of pads included in a pad unit in a lower part of the array substrate.

The array substrate may be exposed to various impacts from its manufacturing process. For example, when the array substrate is transported or when various tests are performed on the array substrate, impacts may be applied to the array substrate. These impacts may create cracks in the substrate. The cracks tend to grow or propagate through inorganic insulating layers disposed on the substrate. That is, when cracks are created in a part of the non-display area, they may propagate to the display area along the inorganic insulating layers, thereby degrading the reliability of the display area. To solve these difficulties, various technical attempts are being made to provide an array substrate structured in such a way to be resistant to impact and suppress the propagation of cracks created in the non-display area.

SUMMARY OF THE INVENTION

Exemplary embodiments of the present invention provide an array substrate structured to prevent the creation of cracks.

Exemplary embodiments of the present invention also provide an array substrate structured to suppress the propagation of cracks.

Exemplary embodiments of the present invention also provide an organic light-emitting display (OLED) structured to prevent the creation of cracks.

Exemplary embodiments of the present invention also provided an OLED structured to suppress the propagation of cracks.

However, exemplary of the present invention are not restricted to the effects set forth herein, as would be apparent one of ordinary skill in the art referencing the present disclosure set forth herein.

According to an exemplary embodiment of the present invention, an array substrate is provided. The array substrate includes a substrate, a barrier layer disposed on the substrate, a buffer layer disposed on the barrier layer, a first insulating layer disposed on the buffer layer, a second insulating layer disposed on the first insulating layer, a plurality of wiring patterns disposed between the first insulating layer and the second insulating layer and/or on the second insulating layer. In addition, the wiring patterns are separated from each other, and extend toward a side of the substrate.

The array substrate further includes a recess pattern disposed adjacent to the wiring patterns and recessed from a top surface of the second insulating layer to expose at least part of the top surface of the substrate, and an organic insulating layer disposed on the second insulating layer and exposing at least part of a portion of the top surface of the substrate which is exposed by the recess pattern.

According to exemplary embodiments of the present invention, there is provided an array substrate which includes a display area and a non-display area located outside the display area.

According to an exemplary embodiment of the present invention, the non-display area of the array substrate includes a substrate, a barrier layer disposed on the substrate, a buffer layer disposed on the barrier layer, a first insulating layer disposed on the buffer layer, a second insulating layer which is disposed on the first insulating layer, a plurality of wiring patterns disposed between the first insulating layer and the second insulating layer and/or on the second insulating layer. In addition, the wiring patterns are separated from each other, and extend toward a side of the substrate. The non-display area of the array substrate further includes a recess pattern recessed from a top surface of the second insulating layer to expose at least part of a top surface of the substrate, and an organic insulating layer disposed on the second insulating layer and exposing at least part of a portion of the top surface of the substrate which is exposed by the recess pattern.

According to an exemplary embodiment of the present invention, an OLED is provided which includes an array substrate and an encapsulation member disposed on the array substrate. The array substrate has a display area and a non-display area located outside the display area. The non-display area includes a substrate, a barrier layer which is disposed on the substrate, a buffer layer which is disposed on the barrier layer, a first insulating layer which is disposed on the buffer layer, a second insulating layer which is disposed on the first insulating layer, and a plurality of wiring patterns which are disposed between the first insulating layer and the second insulating layer and/or on the second insulating layer. In addition, the wiring patterns are separated from each other and extend toward a side of the substrate. The non-display area further includes a recess pattern disposed adjacent to the wiring patterns and which is recessed from a top surface of the second insulating layer to expose at least part of a top surface of the substrate, and an organic insulating layer which is disposed on the second insulating layer and exposes at least part of a portion of the top surface of the substrate which is exposed by the recess pattern.

According to an exemplary embodiment of the present invention, an organic light-emitting display (OLED) is provided. The OLED includes an array substrate including a display area, and a non-display area disposed outside the display area, and an encapsulation member disposed on the array substrate.

The display area of the OLED includes a display area substrate, a display area barrier layer disposed on the display area substrate, a display area buffer layer disposed on the display area barrier layer, a semiconductor layer disposed on the display area buffer layer, a gate insulating layer disposed on the semiconductor layer, a gate wiring including a gate line, a gate electrode and a gate pad disposed on the gate insulating layer, an interlayer insulating film covering the gate wiring, a data wiring including a source electrode, a drain electrode, and a data line disposed on the interlayer insulating film, a planarization layer disposed on the data wiring and the interlayer insulating film, a first electrode disposed on the planarization layer and electrically connected to the drain electrode, a pixel defining layer disposed on the first electrode and exposing a portion of the first electrode, an organic layer disposed on the portion of the first electrode exposed by the pixel defining layer, and a second electrode disposed on the organic layer and the pixel defining layer.

The non-display area of the OLED includes a non-display area substrate, a non-display area barrier layer disposed on the non-display area substrate, a non-display area buffer layer disposed on the non-display area barrier layer, a first insulating layer disposed on the non-display area buffer layer, a second insulating layer disposed on the first insulating layer, a plurality of wiring patterns disposed between the first insulating layer and the second insulating layer and/or on the second insulating layer. In addition, the wiring patterns are separated from each other, and extend toward a side of the non-display area substrate.

In addition, the non-display area of the OLED further includes a recess pattern disposed adjacent to the wiring patterns and recessed from a top surface of the second insulating layer to expose at least part of the top surface of the non-display area substrate, and an organic insulating layer disposed on the second insulating layer and exposing at least part of a portion of the top surface of the non-display area substrate which is exposed by the recess pattern.

BRIEF DESCRIPTION OF THE DRAWINGS

Exemplary embodiments of the present invention can be understood in more detail from the following detailed description taken in conjunction with reference to the attached drawings, in which.

DETAILED DESCRIPTION OF EXEMPLARY EMBODIMENTS OF THE INVENTION

Figure 1:
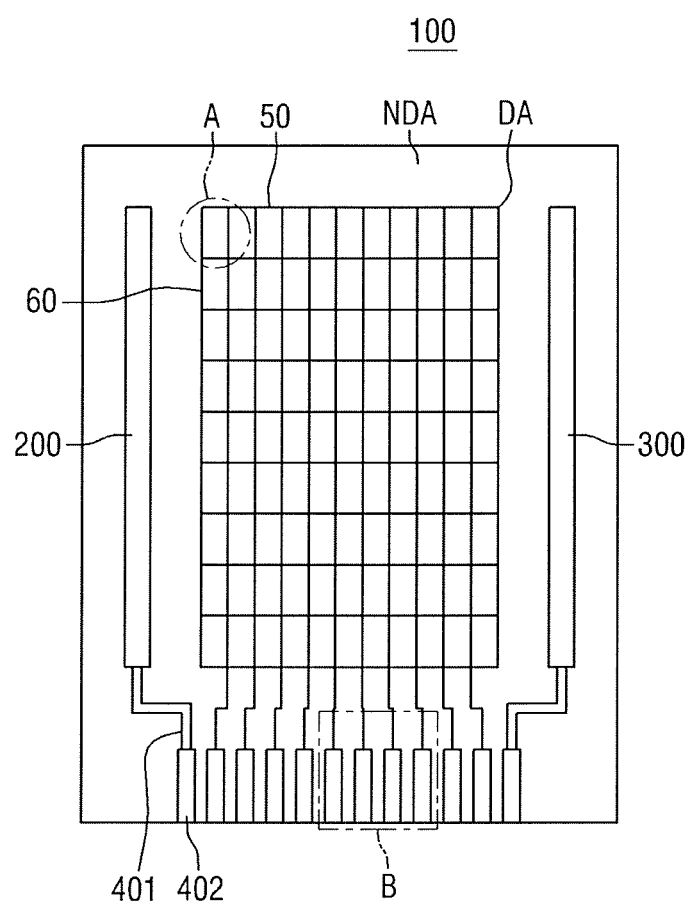
FIG. 1 is a plan view of an array substrate according to an embodiment of the present invention.

Exemplary embodiments of the present invention and methods for achieving the aspects and features will be apparent by referring to the embodiments to be described in detail with reference to the accompanying drawings. However, exemplary embodiments of the present invention are not limited to the embodiments disclosed hereinafter, but can be implemented in diverse forms.

In the entire description of the present invention, the same drawing reference numerals are used for the same elements across various figures.

In the drawings, the thickness of layers, films, panels, regions, etc., may be exaggerated for clarity. It will be understood that when an element such as a layer, film, region, or substrate is referred to as being "on" another element, it can be directly on the other element or intervening elements may also be present.

As used herein, the singular forms, "a", "an", and "the" are intended to include plural forms as well, unless the context clearly indicates otherwise.

Hereinafter, embodiments of the present invention will be described with reference to the attached drawings.

Figure 2:
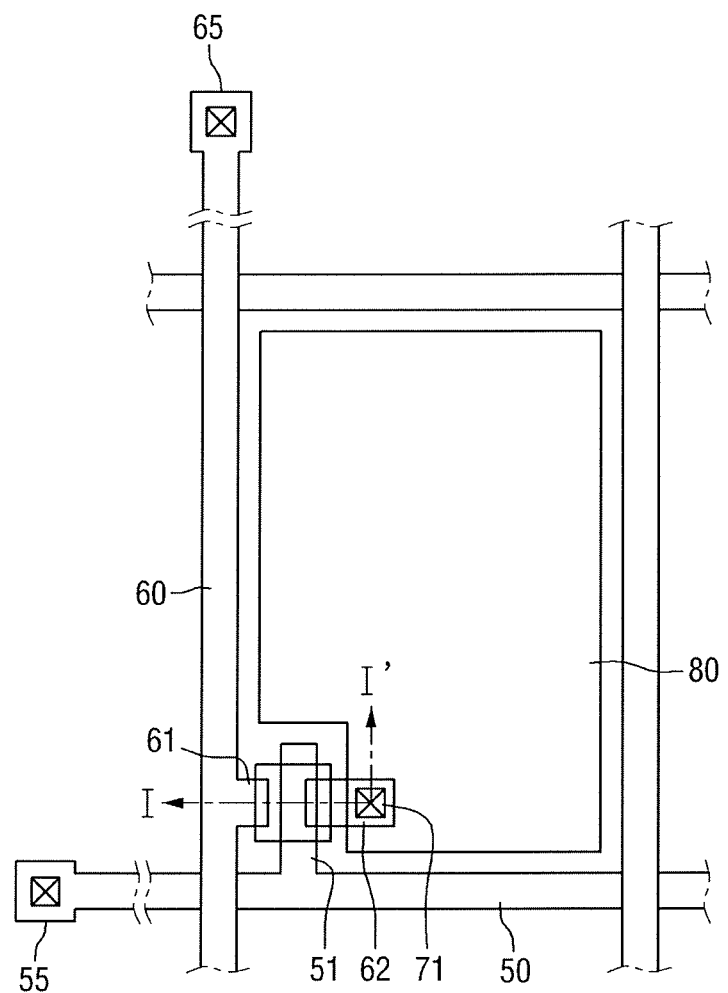
FIG. 2 is a partial enlarged view of a portion 'A' of FIG. 1.
Figure 3:
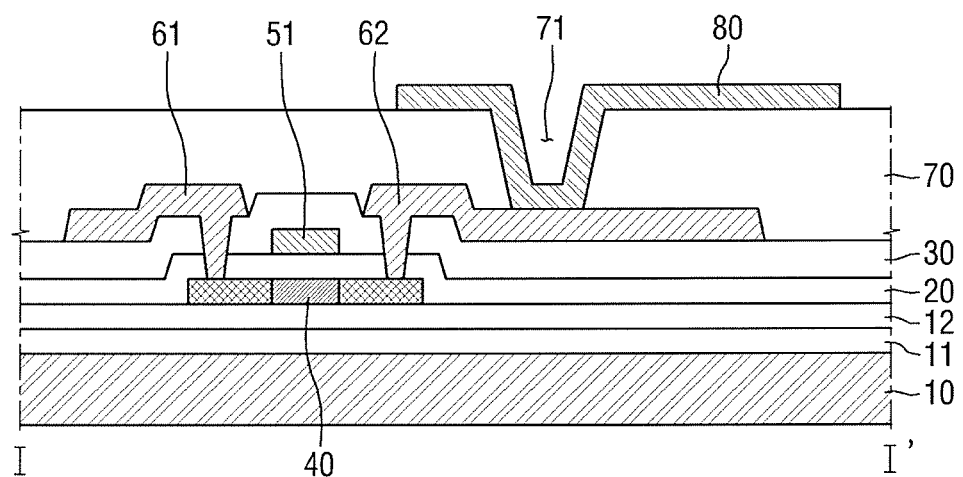
FIG. 3 is a cross-sectional view taken along the line I-I' of FIG. 2.

FIG. 1 is a plan view of an array substrate 100 according to an embodiment of the present invention. FIG. 2 is a partial enlarged view of a portion 'A' of FIG. 1. FIG. 3 is a cross-sectional view taken along the line I-I' of FIG. 2.

Referring to FIGS. 1 through 3, the array substrate 100 according to the current embodiment may include a display area DA and a non-display area NDA located outside the display area DA.

The display area DA may include, for example, a plurality of gate lines 50 which extend in a direction and a plurality of data lines 60 which extend in a direction intersecting the gate lines 50. In addition, a plurality of pixel areas surrounded by the gate lines 50 and the data lines 60 may be defined. A thin-film transistor (TFT) connected to a gate line 50 and a data line 60 may be formed in each of the pixel areas defined by the gate lines 50 and the data lines 60.

The display area DA will now be described in greater detail with reference to FIGS. 2 and 3.

A substrate 10 may be, for example, a plate-shaped member and may support other elements which will be described later. The substrate 10 may be, for example, an insulating substrate and may be formed of a polymer material including glass, quartz or plastic. In an exemplary embodiment, the substrate 10 may be formed of polyimide (PI). However, the material of the substrate 10 is not limited to polyimide. For example, in an exemplary embodiment, the substrate 10 may include polyethersulfone (PES), polyethylenenaphthalate (PEN), polyethylene (PE), polyvinyl chloride (PVC), polyethylene terephthalate (PET), or combinations thereof.

The substrate 10 may be a rigid substrate. However, the substrate 10 is not limited to the rigid substrate and may also be a ductile or flexible substrate. That is, in the present specification, the term "substrate" can be understood as a concept that encompasses, for example, a bendable, foldable, and rollable flexible substrate.

As shown in FIG. 3, the substrate 10 may have a single layer structure. However, the structure of the substrate 10 is not limited to the single layer structure. That is, alternatively, in an exemplary embodiment, the substrate 10 may have a stacked structure of two or more layers. In other words, the substrate 10 may include, for example, a base layer and a protective layer disposed on the base layer.

The base layer may be formed of, for example, an insulating material. In an exemplary embodiment, the base layer may be formed of, for example, polyimide. However, the material of the base layer is not limited to polyimide. The protective layer may be disposed on the base layer. The protective layer may be formed of, for example, an organic material or an inorganic material. For example, the protective layer may include one or more materials selected from polyethylene terephthalate (PET) and polyethylene naphthalate (PEN). However, the material of the protective layer is not limited to the above examples.

A barrier layer 11 may be disposed on the substrate 10. The barrier layer 11 may prevent penetration of impurity elements from the substrate 10. In an exemplary embodiment, the barrier layer 11 may be formed of, for example, one or more materials selected from the group consisting of silicon oxide (SiOx) and silicon nitride (SiNx). However, the material of the barrier layer 11 is not limited to the above examples. The barrier layer 11 may have a single layer structure or a stacked structure of two or more layers. In an exemplary embodiment in which the barrier layer 11 consists of two layers, the two layers may be formed of, for example, different materials. For example, a first layer may be formed of silicon oxide, and a second layer may be formed of silicon nitride. However, the structure of the barrier layer 11 is not limited to the above example.

Alternatively, in an exemplary embodiment, the barrier layer 11 can be omitted depending on the material of the substrate 10 or process conditions.

A buffer layer 12 may be formed on the barrier layer 11 to cover the barrier layer 11. The buffer layer 12 may be, for example, an inorganic layer formed of an inorganic material. In an exemplary embodiment, the buffer layer 12 may be formed of, for example, one or more materials selected from the group consisting of silicon oxide (SiOx), silicon nitride (SiNx), aluminum oxide (AlOx), and silicon oxynitride (SiON). However, the material of the buffer layer 12 is not limited to the above examples. In addition, the buffer layer 12 may have a single layer structure or a stacked structure of two or more layers. In an exemplary embodiment in which the buffer layer 12 consists of two layers, the two layers may be formed of, for example, different materials. For example, a first layer may be formed of silicon oxide, and a second layer may be formed of silicon nitride. However, the structure of the buffer layer 12 is not limited to the above example.

A semiconductor layer 40 may be formed on the buffer layer 12. The semiconductor layer 40 may be formed of, for example, amorphous silicon or polycrystalline silicon. In an exemplary embodiment, the semiconductor layer 40 may be formed by, for example, coating, patterning, and then crystallizing amorphous silicon. However, a method of forming the semiconductor layer 40 is not limited to the above example. In the present specification, the term "semiconductor layer" can be understood as an oxide semiconductor layer.

A gate insulating layer 20 may be formed on the semiconductor layer 40. The gate insulating layer 20 may include, for example, at least one of silicon nitride, silicon oxide, silicon oxynitride (SiOxNy), aluminum oxide (AlOx), yttrium oxide ($Y_2O_3$), hafnium oxide (HfOx), zirconium oxide (ZrOx), aluminum nitride (AlN), aluminum oxynitride (AlNO), titanium oxide (TiOx), barium titanate (BaTiO3) and lead titanate ($PbTiO_3$), but the material of the gate insulating layer 20 is not limited to the above examples. The gate insulating layer 20 may have a single layer structure. However, the structure of the gate insulating layer 20 is not limited to the single layer structure. The gate insulating layer 20 may also have a multilayer structure which includes two or more insulating layers with different physical properties.

A gate wiring including a gate line 50, a gate electrode 51 and a gate pad 55 may be disposed on the gate insulating layer 20. The gate wiring may be formed of, for example, one or more materials selected from the group consisting of aluminum (Al)-based metal such as aluminum or an aluminum alloy, silver (Ag)-based metal such as silver or a silver alloy, copper (Cu)-based metal such as copper or a copper alloy, molybdenum (Mo)-based metal such as molybdenum or a molybdenum alloy, chromium (Cr), titanium (Ti), and tantalum (Ta). In addition, in an embodiment, the gate wiring may be formed of, for example, at least one material selected from the group consisting of, for example, nickel (Ni), gold (Au), palladium (Pd), platinum (Pt), neodymium (Nd), zinc (Zn), cobalt (Co), silver (Ag), manganese (Mn) or any alloys thereof. However, the material of the gate wiring is not limited to the above examples, and any transparent or semitransparent material having conductivity can be used to form the gate wiring.

The gate line 50 may be provided in a plurality as described above, and the gate lines 50 may extend, for example, in a direction to be parallel to each other.

An interlayer insulating film 30 may be disposed on the gate wiring to cover the gate wiring. The interlayer insulating film 30 may be, for example, an inorganic layer formed of an inorganic material. In an exemplary embodiment, the interlayer insulating film 30 may include, for example, silicon nitride or silicon oxide, but the material of the interlayer insulating film 30 is not limited to the above examples. The interlayer insulating film 30 may have a single layer structure. However, the structure of the interlayer insulating film 30 is not limited to the single layer structure. The interlayer insulating film 30 may also have a multilayer structure which includes two or more insulating layers with, for example, different physical properties. The interlayer insulating film 30 having the multilayer structure will be described later.

A data wiring including, for example, a source electrode 61, a drain electrode 62 and a data line 60 may be disposed on the interlayer insulating film 30. The data wiring may be formed of, for example, molybdenum, chromium, a refractory metal such as tantalum and titanium, or an alloy of these materials. In addition, in an embodiment, the data wiring may be formed of, for example, at least one material selected from the group consisting of, for example, nickel (Ni), gold (Au), palladium (Pd), platinum (Pt), neodymium (Nd), zinc (Zn), cobalt (Co), silver (Ag), manganese (Mn) or any alloys thereof. However, the material of the data wiring is not limited to the above examples, and any transparent or semitransparent material having conductivity can be used to form the data wiring.

The data line 60 may deliver a data signal and may be placed to intersect the gate line 50. That is, for example, in an exemplary embodiment, the gate line 50 may extend in a horizontal direction, and the data line 60 may extend in a vertical direction to intersect the gate line 50.

In FIG. 2, the data line 60 and the gate line 50 are shaped, for example, like straight lines. In an exemplary embodiment, however, the data line 60 and the gate line 60 may also be bent.

The source electrode 61 may be, for example, a portion of the data line 60 and may lie in the same plane with the data line 60. The drain electrode 62 may extend, for example, parallel to the source electrode 61. In this case, the drain electrode 62 may be, for example, parallel to the portion of the data line 60.

The gate electrode 51, the source electrode 61 and the drain electrode 62 form one TFT, together with the semiconductor layer 40. A channel of the TFT may be formed in the semiconductor layer 40 between the source electrode 61 and the drain electrode 62.

A planarization layer 70 may be disposed on the data wiring to cover the data wiring and the interlayer insulating film 30. The planarization layer 70 may be, for example, relatively thicker than the interlayer insulating film 30. Due to this difference in the thicknesses of the planarization layer 70 and the interlayer insulating film 30, a top surface of the planarization layer 70 may be relatively flatter than a bottom surface thereof which contacts the interlayer insulating film 30 and the source and drain electrodes 61 and 62. To reduce a step difference on the substrate 10, the planarization layer 70 may include, for example, one or more materials selected from the group consisting of acrylic, benzocyclicbutene (BCB), and polyimide. However, the material of the planarization layer 70 is not limited to the above examples. In addition, the planarization layer 70 may be formed of, for example, a photosensitive material.

A first contact hole 71 may be formed in the planarization layer 70 to expose at least part of the drain electrode 62. For example, the first contact hole 71 may penetrate through the planarization layer 70 and partially expose a top surface of the drain electrode 62.

A first electrode 80 may be disposed on the planarization layer 70 and an exposed portion of the drain electrode 62. That is, the first electrode 80 may cover the planarization layer 70, sidewalls of the first contact hole 71, and the top surface of the drain electrode 62. Accordingly, the first electrode 80 and the drain electrode 62 may be electrically connected to each other. In an exemplary embodiment, the first electrode 80 may be, but is not limited to, an anode. The first electrode 80 may be formed of, for example, indium tin oxide (ITO), indium zinc oxide (IZO), cadmium tin oxide (CTO), aluminum zinc oxide (AZO), indium tin zinc oxide (ITZO), cadmium oxide (CdO), hafnium oxide (HfO), indium gallium zinc oxide (InGaZnO), indium gallium zinc magnesium oxide (InGaZnMgO), indium gallium magnesium oxide (InGaMgO) or indium gallium aluminum oxide (InGaAlO). However, the material of the first electrode 80 is not limited to the above examples. A pixel defining layer, an organic layer, and a second electrode may be disposed on the first electrode 80. These elements will be described in greater detail later.

The non-display area NDA of the array substrate 100 according to the current embodiment will now be described.

For example, referring back to FIG. 1, a scan driver 200, an emission driver 300, and a plurality of wiring patterns which are connected to the scan driver 200, the emission driver 300 or the display area DA may be disposed in the non-display area NDA located outside the display area DA. Each of the wiring patterns may include, for example, a wiring line 401 and a wiring pad 402. For example, the wiring line 401 may extend from the scan driver 200, the emission driver 300 or the display area DA, and the wiring pad 402 may be disposed at an end of the wiring line 401 and may have an end wider than the wiring line 401. The structure of each of the wiring patterns will be described in greater detail later.

The non-display area NDA will be described in greater detail with reference to FIGS. 4 through 7.

Figure 4:
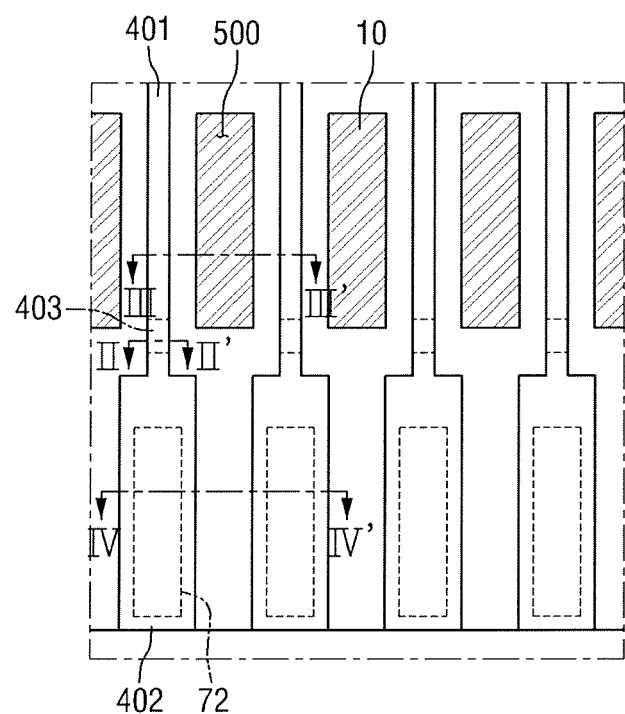
FIG. 4 is a partial enlarged view of a portion 'B' of FIG. 1.
Figure 5:
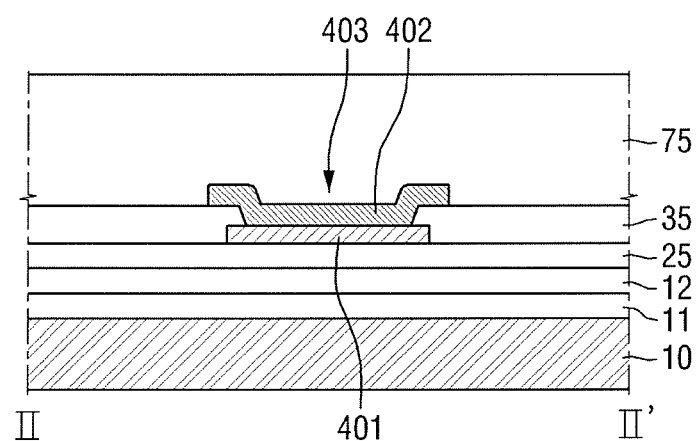
FIG. 5 is a cross-sectional view taken along the line II-II' of FIG. 4.
Figure 6:
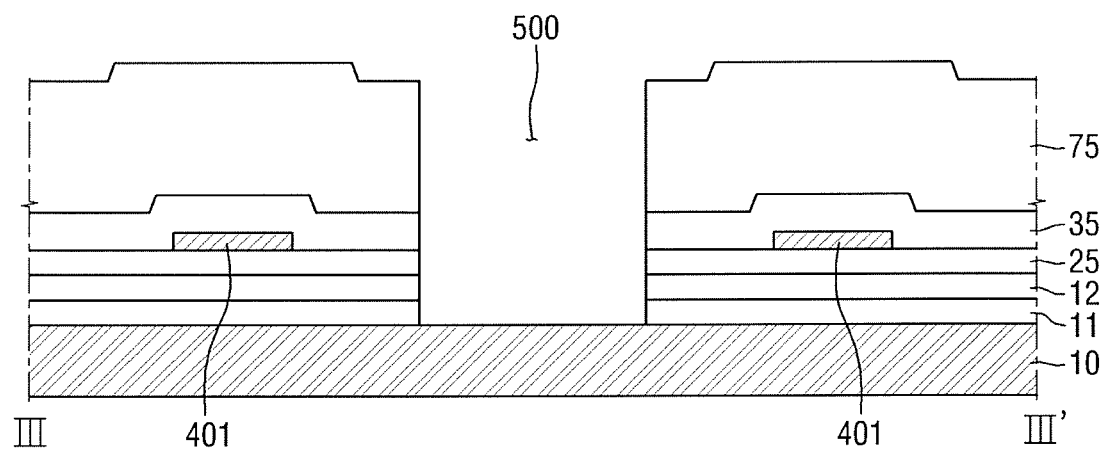
FIG. 6 is a cross-sectional view taken along the line III-III' of FIG. 4.
Figure 7:
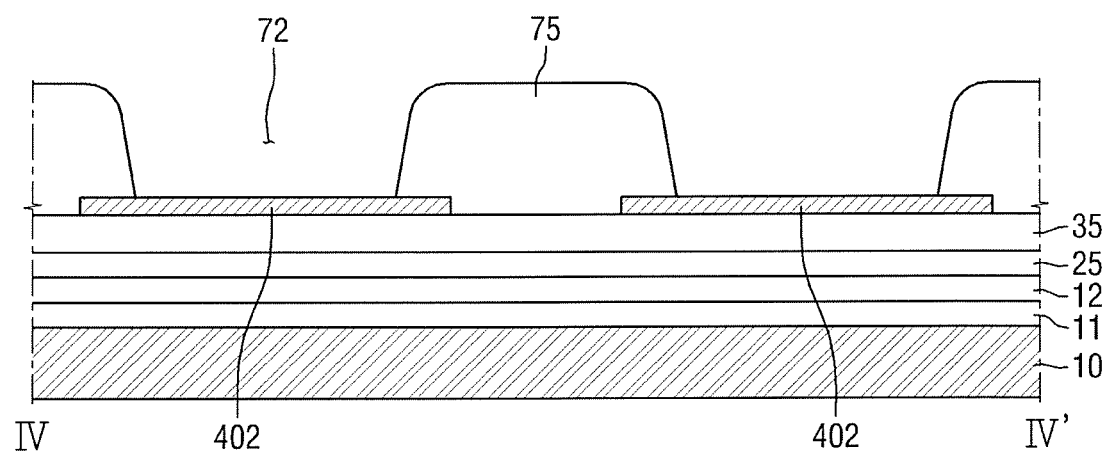
FIG. 7 is a cross-sectional view taken along the line IV-IV' of FIG. 4.

FIG. 4 is a partial enlarged view of a portion 'B' of FIG. 1. FIG. 5 is a cross-sectional view taken along the line II-II' of FIG. 4. FIG. 6 is a cross-sectional view taken along the line III-Ill' of FIG. 4. FIG. 7 is a cross-sectional view taken along the line IV-IV' of FIG. 4.

Referring to FIGS. 4 through 7, the non-display area NDA of the array substrate 100 according to the current embodiment includes, for example, a substrate 10, a barrier layer 11 which is disposed on the substrate 10, a buffer layer 12 which is disposed on the barrier layer 11, a first insulating layer 25 which is disposed on the buffer layer 12, a second insulating layer 35 which is disposed on the first insulating layer 25, and a plurality of wiring patterns. The wiring patterns are disposed between the first insulating layer 25 and the second insulating layer 35 and on the second insulating layer 35. In addition, the wiring patterns are separated from each other, and extend toward a side of the substrate 10. The non-display area NDA further includes, for example, a recess pattern 500 which is recessed from a top surface of the second insulating layer 35 by a predetermined depth to expose at least part of a top surface of the substrate 10, and an organic insulating layer 75 which is disposed on the second insulating layer 35 and exposes at least part of a portion of the top surface of the substrate 10 which is exposed by the recess pattern 500.

The substrate 10, the barrier layer 11, and the buffer layer 12 may be substantially identical to those described above with reference to FIGS. 1 through 3, and thus a detailed description thereof will be omitted.

The first insulating layer 25 may be disposed on the buffer layer 12. The first insulating layer 25 may be, for example, an inorganic insulating layer formed of an inorganic material. The first insulating layer 25 may be formed of, e.g., silicon nitride or silicon oxide. However, the material of the first insulating layer 25 is not limited to the above examples.

In an exemplary embodiment, the first insulating layer 25 may be formed of, for example, substantially the same material as the gate insulating layer 20 of the display area DA. In other words, the first insulating layer 25 of the non-display area NDA may be formed at substantially the same time as the gate insulating layer 20 of the display area DA. However, this is merely an example, and exemplary embodiments of the present invention are not limited to this example. That is, the first insulating layer 25 of the non-display area NDA and the gate insulating layer 20 of the display area DA may also be formed independently as separate elements.

The second insulating layer 35 may be disposed on the first insulating layer 25. Like the first insulating layer 25, the second insulating layer 35 may be, for example, an inorganic insulating layer formed of an inorganic material. Like the first insulating layer 25, the second insulating layer 35 may include, for example, silicon nitride or silicon oxide. The first insulating layer 25 and the second insulating layer 35 may be formed of, for example, different materials. However, exemplary embodiments of the present invention are not limited thereto, and the first insulting layer 25 and the second insulating layer 35 may also be formed of the same material. In an exemplary embodiment, the second insulating layer 35 may be formed of, for example, substantially the same material as the interlayer insulating film 30 of the display area DA. That is, the second insulating layer 35 may be formed at substantially the same time as the interlayer insulating film 30 of the display area DA. However, this is merely an example, and exemplary embodiments of the present invention are not limited to this example. That is, the interlayer insulating film 30 of the display area DA and the second insulating layer 35 of the non-display area NDA may also be formed independently as separate elements.

The wiring patterns may be disposed on the first insulating layer 25 and the second insulating layer 35. In other words, the wiring patterns may be disposed on the first insulating layer 25 to be interposed between the first insulating layer 25 and the second insulating layer 35 and/or may be disposed on the second insulating layer 35. For example, in an exemplary embodiment, a portion of each of the wiring patterns may be formed on the first insulating layer 25, and the remaining portion of each of the wiring patterns may be formed on the second insulating layer 35.

The wiring patterns may be connected to the display area DA, the scan driver 200 or the emission driver 300 so as to transmit or receive signals. To this end, the wiring patterns may be formed of, for example, one or more materials selected from the group consisting of aluminum (Al)-based metal such as aluminum or an aluminum alloy, silver (Ag)-based metal such as silver or a silver alloy, copper (Cu)-based metal such as copper or a copper alloy, molybdenum (Mo)-based metal such as molybdenum or a molybdenum alloy, chrome (Cr), titanium (Ti), and tantalum (Ta). In addition, in an embodiment, the wiring patterns may be formed of, for example, at least one material selected from the group consisting of, for example, nickel (Ni), gold (Au), palladium (Pd), platinum (Pt), neodymium (Nd), zinc (Zn), cobalt (Co), silver (Ag), manganese (Mn) or any alloys thereof. However, the material of the wiring patterns is not limited to the above examples, and a conductor having conductivity can be used to form the wiring patterns.

In an exemplary embodiment, each of the wiring patterns may include, for example, a wiring line 401, a wiring pad 402, and a wiring connection portion 403.

The wiring line 401 may be electrically connected to the display area DA, the scan driver 200 or the emission driver 300 and may extend from the display area DA, the scan driver 200 or the emission driver 300 toward a side of the substrate 10. The wiring line 401 may be provided in a plurality, and the wiring lines 401 may be separated from each other by a predetermined distance. Each of the wiring lines 401 may extend, for example, in a straight line or may be bent one or more times to extend toward the side of the substrate 10.

In an exemplary embodiment, the wiring line 401 may be disposed on the first insulating layer 25. That is, the wiring line 401 may be interposed between the first insulating layer 25 and the second insulating layer 35. The wiring line 401 may be formed of, for example, the same material as the gate wiring of the display area DA. In other words, the wiring line 401 may be formed at substantially the same time as the gate wiring of the display area DA. However, exemplary embodiments of the present invention are not limited thereto, and the wiring line 401 of the non-display area NDA and the gate wiring of the display area DA may also be formed independently.

A first end of the wiring line 401 may, for example, partially overlap a second end of the wiring pad 402 which will be described later.

For example, the wiring pad 402 may be electrically connected to the first end of the wiring line 401 and may extend from the first end of the wiring line 401 toward a side of the substrate 10. The wiring pad 402 may be provided in a plurality, and the wiring pads 402 may be arranged along the side of the substrate 10. In an exemplary embodiment, a first end of the wiring pad 402 may contact the side of the substrate 10, but exemplary embodiments of the present invention are not limited thereto. The second end of the wiring pad 402 may be, for example, relatively wider than the wiring line 401. An external circuit module, such as, for example, a test device for testing the performance of the substrate 10 or a flexible printed circuit board (FPCB) connected to the substrate 10, may be connected to the wiring pad 402. When the wiring pad 402 is wider than the wiring line 401, it can be electrically connected to the circuit module more easily.

In an exemplary embodiment, the wiring pad 402 may be disposed on the second insulating layer 35. That is, the wiring pad 402 and the wiring line 401 may be disposed at, for example, different levels. In other words, the wiring pad 402 and the wiring line 401 may be disposed on different layers.

The wiring line 401 and the wiring pad 402 may be electrically connected to each other. For example, the first end of the wiring line 401 may be electrically connected to the second end of the wiring pad 402. In an exemplary embodiment in which the wiring line 401 is disposed on the first insulating layer 25 and the wiring pad 402 is disposed on the second insulating layer 35, the wiring pad 402 and the wiring line 401 may be electrically connected to each other through the wiring connection portion 403. The wiring connection portion 403 will now be described in greater detail with reference to FIG. 5.

Referring to FIG. 5, the second insulating layer 35 is disposed on the wiring line 401 to expose at least part of the wiring line 401. The wiring pad 402 is disposed on a portion of the wiring line 401 which is exposed by the second insulating layer 35. Accordingly, the wiring pad 402 and the wiring line 401 are electrically connected to each other.

At least one recess pattern 500 may be disposed adjacent to the wiring patterns. The recess pattern 500 may be recessed from, for example, the top surface of the second insulating layer 35 by a predetermined distance. The recess pattern 500 recessed from the top surface of the second insulating layer 35 by the predetermined distance may expose at least part of the top surface of the substrate 10. In other words, a bottom surface of the recess pattern 500 may include at least part of the top surface of the substrate 10.

To put it another way, the recess pattern 500 may penetrate through the barrier layer 11, the buffer layer 12, the first insulating layer 25, and the second insulating layer 35 to expose at least part of the top surface of the substrate 10. That is, in an exemplary embodiment, the bottom surface of the recess pattern 500 may consist of the top surface of the substrate 10, and sidewalls of the recess patterns 500 may consist of inner side surfaces of the barrier layer 11, the buffer layer 12, the first insulating layer 25 and the second insulating layer 35. However, exemplary embodiments of the present invention are not limited thereto. When an intermediate layer is interposed between the second insulating layer 35 and the substrate 10 or when another layer is disposed on the second insulating layer 35, the sidewalls of the recess pattern 500 may further include, for example, inner side surfaces of the intermediate layer and inner side surfaces of the layer disposed on the second insulating layer 35. This will be described in greater detail later.

In an exemplary embodiment, at least one recess pattern 500 may be disposed adjacent to the wiring lines 401 or disposed between a wiring line 401 and another wiring line 401.

In FIGS. 4 and 6, the recess pattern 500 is disposed adjacent to the wiring lines 401 but is separated from each of the wiring lines 401 by a predetermined distance. However, exemplary embodiments of the present invention are not limited thereto. The recess pattern 500 may also contact at least part of each of the wiring lines 401.

The recess pattern 500 that penetrates through one or more inorganic insulating layers on the substrate 10 can suppress the propagation of cracks created by impacts applied to the array substrate 100 during processes of manufacturing, testing, and transporting the array substrate 100. That is, cracks created by various impacts tend to grow or propagate through the inorganic insulating layers of the substrate 10. However, if the recess pattern 500 is formed by removing part of the inorganic insulating layers as described above, it can suppress the propagation of the cracks by blocking the propagation path of the cracks. That is, it is possible to hinder cracks created in the non-display area NDA from growing to reach the display area DA. In other words, the recess pattern 500 can serve as a crack stopper.

The organic insulating layer 75 may be disposed on the second insulating layer 35. The organic insulating layer 75 may be formed of an organic material. In an exemplary embodiment, the organic insulating layer 75 may include, for example, one or more materials selected from the group consisting of acrylic, benzocyclicbutene (BCB), and polyimide. However, the material of the organic insulating layer 75 is not limited to the above examples. In addition, the organic insulating layer 75 may be formed of, for example, a photosensitive material.

In an area where the wiring lines 401 are formed, the organic insulating layer 75 disposed on the second insulating layer 35 may expose at least part of the recess pattern 500 (see FIG. 6). That is, the organic insulating layer 75 may expose at least part of a portion of the top surface of the substrate 10 which is exposed by the recess pattern 500. In other words, the organic insulating layer 75 may fully or partially expose the portion of the top surface of the substrate 10 which is exposed by the recess pattern 500.

In an area where the wiring pads 402 are disposed, the organic insulating layer 75 may partially cover the second insulating layer 35 and the wiring pads 402 disposed on the second insulating layer 35 (see FIG. 7). That is, the organic insulating layer 75 may partially expose the wiring pads 402. In other words, the organic insulating layer 75 may include, for example, a contact 72 which penetrates through the organic insulating layer 75 to expose at least part of a top surface of each of the wiring pads 402. As described above, various test devices for testing the performance of the substrate 10 or an FPC connected to the substrate 10 may be connected to the wiring pads 402. That is, the contact 72 may expose each of the wiring pads 402, thereby inducing each of the wiring pads 402 to be connected to the above devices.

In an exemplary embodiment, the organic insulating layer 75 may be formed of, for example, substantially the same material as the planarization layer 70 of the display area DA. In other words, the organic insulating layer 75 may be formed at the same time as the planarization layer 70 of the display area DA. However, this is merely an example, and exemplary embodiments of the present invention are not limited to this example. The planarization layer 70 of the display area DA and the organic insulating layer 75 of the non-display area NDA may also be formed independently as separate elements.

Hereinafter, embodiments of the present invention will be described. In the following embodiments, elements identical to those described above are indicated by like reference numerals, and a redundant description thereof will be omitted or given briefly.

Figure 8:
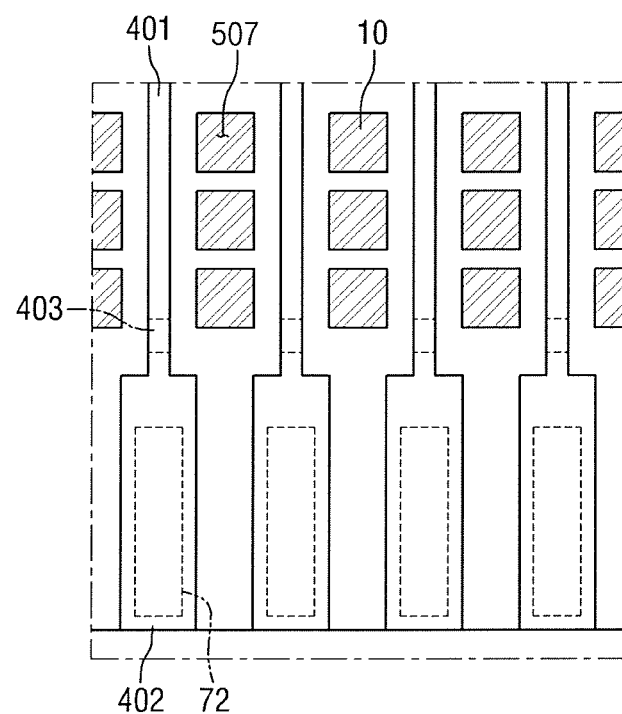
FIG. 8 is a partial enlarged view of an array substrate according to a modified example of the embodiment of FIG. 4.

FIG. 8 is a partial enlarged view of an array substrate according to a modified example of the embodiment of FIG. 4. Referring to FIG. 8, the array substrate according to the current modified example is different from the array substrate 100 according to FIG. 4 in that a plurality of recess patterns 507 are formed between a wiring line 401 and another adjacent wiring line 401.

For example, one or more recess patterns 507 may be disposed between a wiring line 401 and another adjacent wiring line 401. In FIG. 8, three recess patterns 507 are arranged, for example, in a line between a wiring line 401 and another adjacent wiring line 401. However, the number and arrangement of the recess patterns 507 are not limited to the above example. That is, a plurality of recess patterns 507 may be provided, and the recess patterns 507 may be arranged, for example, in a line or in a matrix of columns and rows. This will be described later.

Figure 9:
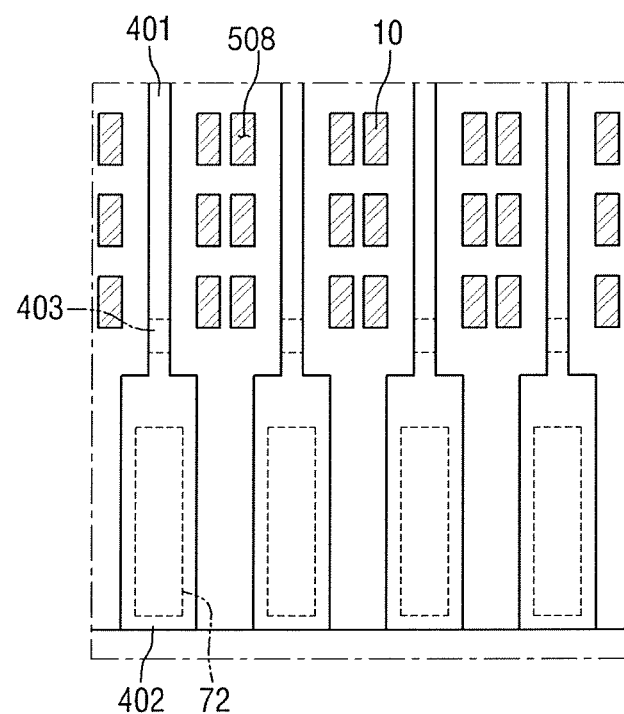
FIG. 9 is a partial enlarged view of an array substrate according to a modified example of the modified example of FIG. 8.

FIG. 9 is a partial enlarged view of an array substrate according to a modified example of the modified example of FIG. 8. The array substrate according to the current modified example is different from the array substrate according to the modified embodiment of FIG. 8 in that a plurality of recess patterns 508 are arranged in a matrix of columns and rows between a wiring line 401 and another adjacent wiring line 401.

As described above, a plurality of recess patterns 508 may be disposed between a wiring line 401 and another adjacent wiring line 401. The recess patterns 508 may be arranged, for example, in a line or in a matrix of columns and rows. In FIG. 9, the recess patterns 508 are arranged in a 3×2 matrix (having three rows and two columns), but the arrangement of the recess patterns 508 is not limited to this example. That is, the number of rows and the number of columns may be greater than or equal to two. In FIG. 9, the recess patterns 508 are arranged regularly. However, exemplary embodiments of the present invention are not limited thereto, and the recess patterns 508 may also be arranged irregularly.

Figure 10:
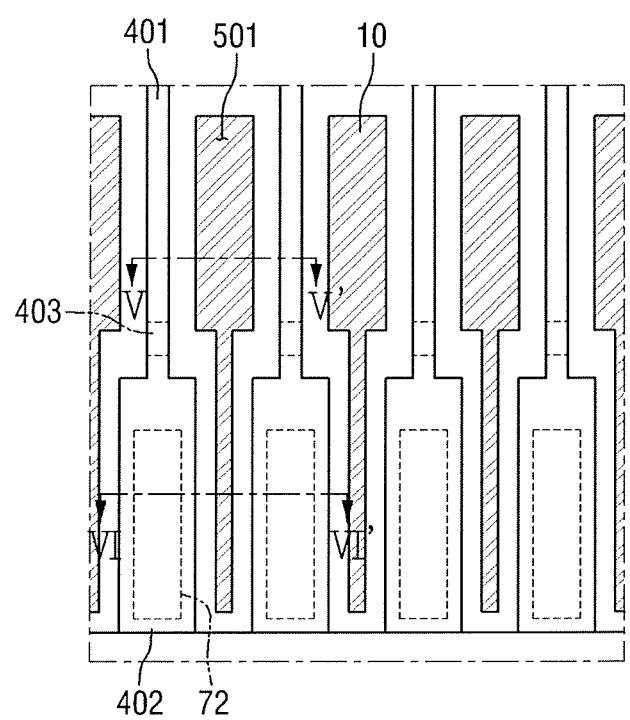
FIG. 10 is a partial enlarged view of an array substrate according to a modified example of the embodiment of FIG. 4.
Figure 11:
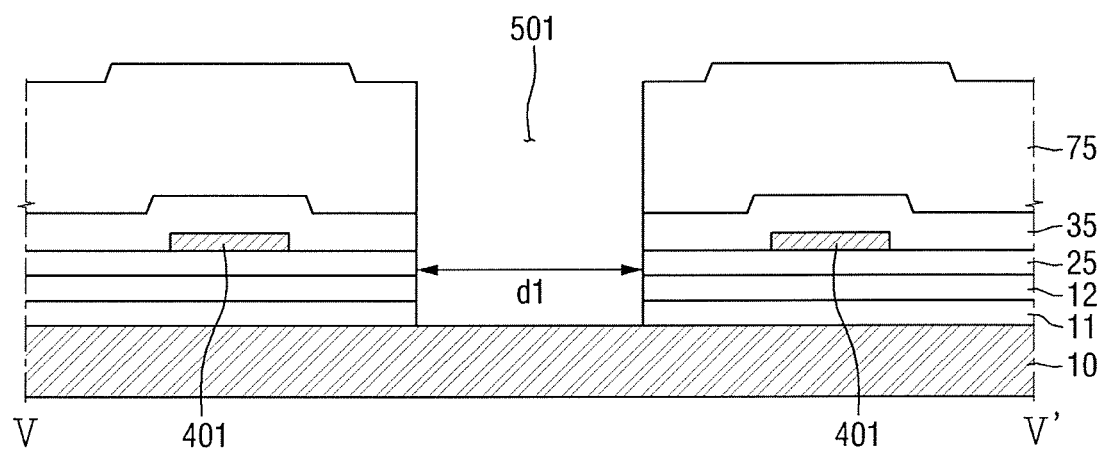
FIG. 11 is a cross-sectional view taken along the line V-V' of FIG. 10.
Figure 12:
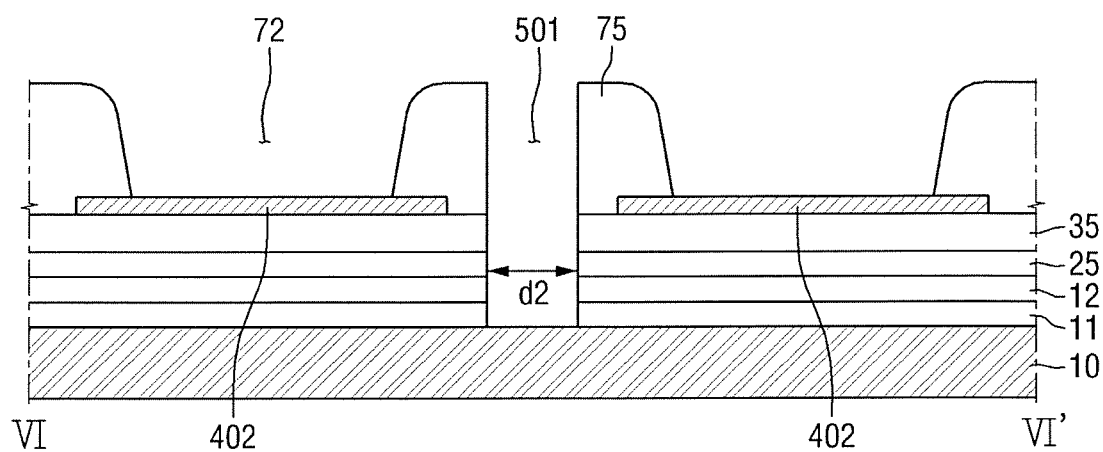
FIG. 12 is a cross-sectional view taken along the line VI-VI' of FIG. 10.

FIG. 10 is a partial enlarged view of an array substrate according to a modified example of the embodiment of FIG. 4. FIG. 11 is a cross-sectional view taken along the line V-V' of FIG. 10. FIG. 12 is a cross-sectional view taken along the line VI-VI' of FIG. 10.

Referring to FIGS. 10 through 12, the array substrate according to the current modified example is different from the array substrate 100 according to FIG. 4 in that a recess pattern 501 disposed between wiring lines 401 extends to between wiring pads 402.

The recess pattern 501 disposed between a wiring line 401 and another wiring line 401 may extend to, for example, between a wiring pad 402 connected to the former wiring line 401 and another wiring pad 402 connected to the latter wiring line 402. That is, the recess pattern 501 disposed between adjacent wiring lines 401 may extend toward a side of a substrate 10. As described above, the wiring pads 402 may be, for example, relatively wider than the wiring lines 401. Accordingly, a width d1 of the recess pattern 501 disposed between the wiring lines 401 may be, for example, relatively greater than a width d2 of the recess pattern 501 disposed between the wiring pads 402. However, exemplary embodiments of the present invention are not limited thereto, and the width d1 of the recess pattern 501 disposed between the wiring lines 401 may be substantially equal to the width d2 of the recess pattern 501 disposed between the wiring pads 402.

Figure 13:
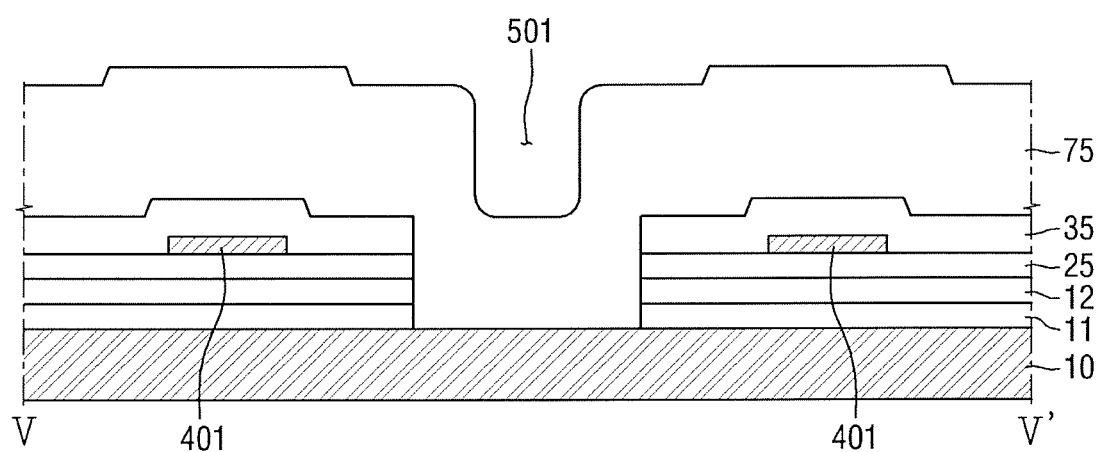
FIG. 13 is a cross-sectional view of an array substrate according to a modified example of the modified example of FIG. 11.
Figure 14:
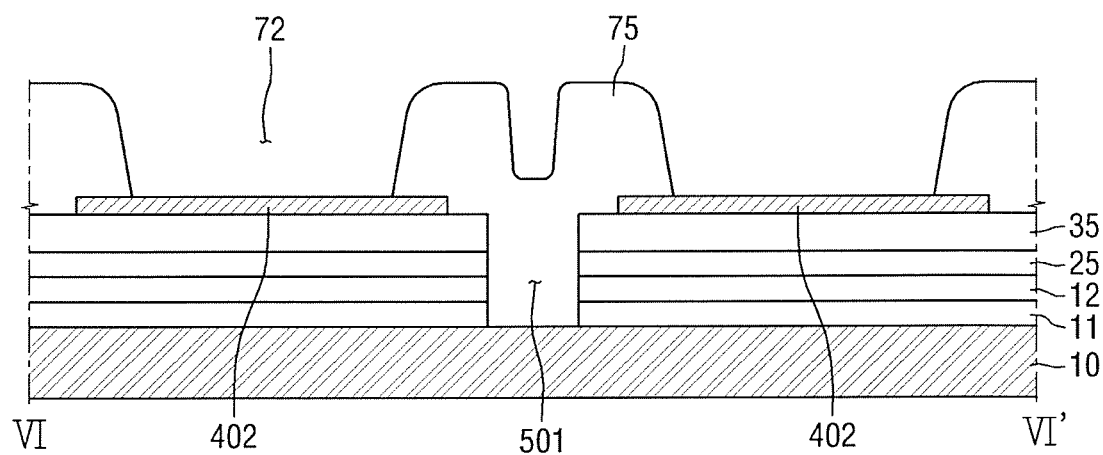
FIG. 14 is a cross-sectional view of an array substrate according to a modified example of the modified example of FIG. 12.

FIG. 13 is a cross-sectional view of an array substrate according to a modified example of the modified example of FIG. 11. FIG. 14 is a cross-sectional view of an array substrate according to a modified example of the modified example of FIG. 12.

The modified example of FIGS. 13 and 14 is different from the modified example of FIGS. 11 and 12 in that an organic insulating layer 75 disposed on a second insulating layer 35 covers a portion of a substrate 10 which is exposed by a recess pattern 501. As described above, the organic insulating layer 75 may be disposed on the second insulating layer 35. In an exemplary embodiment, the organic insulating layer 75 may, for example, completely cover a portion of a top surface of the substrate 10 which is exposed by the recess pattern 501. That is, the organic insulating layer 75 may cover the second insulating layer 35, sidewalls of the recess pattern 501, and a bottom surface of the recess pattern 501. In FIGS. 13 and 14, the organic insulating layer 75 completely covers the portion of the top surface of the substrate 10 which is exposed by the recess pattern 501. However, exemplary embodiments of the present invention are not limited thereto, and the organic insulating layer 75 may fully or partially expose the portion of the top surface of the substrate 10 which is exposed by the recess pattern 501. A contact 72 which exposes at least part of each wiring pad 402 may be formed in the organic insulating layer 75. As the contact 72 is substantially identical to the contact 72 described above with reference to FIG. 7, a detailed description thereof will be omitted.

Figure 15:
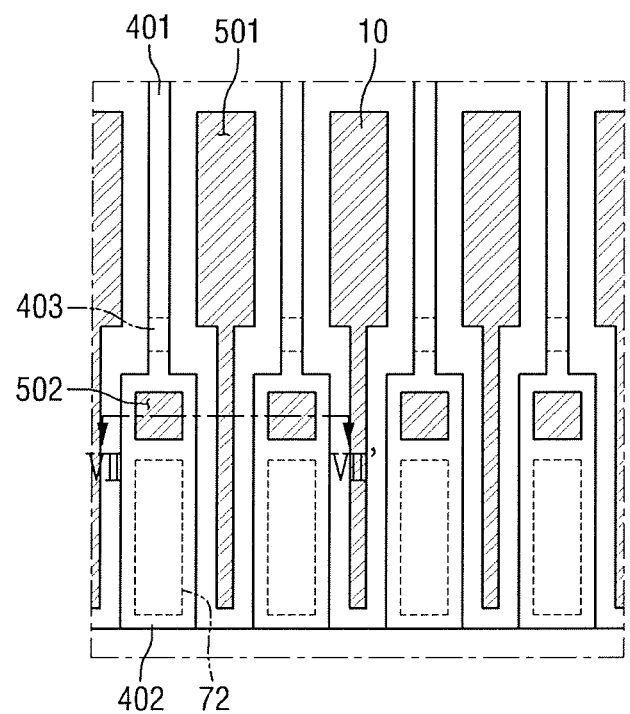
FIG. 15 is a partial enlarged view of an array substrate according to a modified example of the modified example of FIG. 10.
Figure 16:
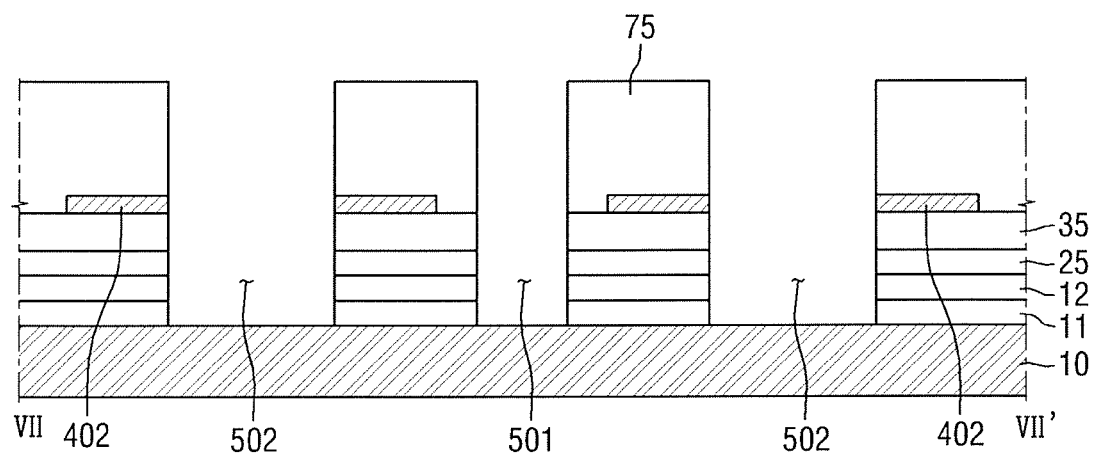
FIG. 16 is a cross-sectional taken along the line VII-VII' of FIG. 15.

FIG. 15 is a partial enlarged view of an array substrate according to a modified example of the modified example of FIG. 10. FIG. 16 is a cross-sectional taken along the line VII-VII' of FIG. 15.

Referring to FIGS. 15 and 16, the array substrate according to the current modified example is different from the modified example of FIG. 10 in that it further includes a recess groove 502 which is formed inside each wiring pad 402 and penetrates through each wiring pad 402 to expose a top surface of a substrate 10.

The recess groove 502 may be disposed inside each wiring pad 402. For example, the recess groove 502 may be disposed inside an outer circumference of each wiring pad 402.

The recess groove 502 may sequentially penetrate through each wiring pad 402, a second insulating layer 35, a first insulating layer 25, a buffer layer 12 and a barrier layer 11 to expose the top surface of the substrate 10. That is, for example, a bottom surface of the recess groove 502 may include the top surface of the substrate 10, and sidewalls of the recess groove 502 may include inner side surfaces of each wiring pad 402, the second insulating layer 35, the first insulating layer 25, the buffer layer 12 and the barrier layer 11*t*.

As described above, an organic insulating layer 75 may be disposed on the second insulating layer 35 and each wiring pad 402. In FIG. 16, the organic insulating layer 75 completely exposes a portion of the top surface of the substrate 10 which is exposed by the second insulating layer 35, each wiring pad 402, and the recess groove 502. However, exemplary embodiments of the present invention are not limited thereto, and the organic insulating layer 75 may also cover at least part of the portion of the top surface of the substrate 10 which is exposed by the recess groove 502. If the recess groove 502 penetrating through each wiring pad 402 to expose the top surface of the substrate 10 is formed in each wiring pad 402, cracks created by impacts applied to the wiring pads 402 when a substrate test device or an FPC is connected to or disconnected from the wiring pads 402 can be prevented from propagating to a display area DA through the wiring pads 402 or through inorganic insulating layers disposed under the wiring pads 402.

Figure 17:
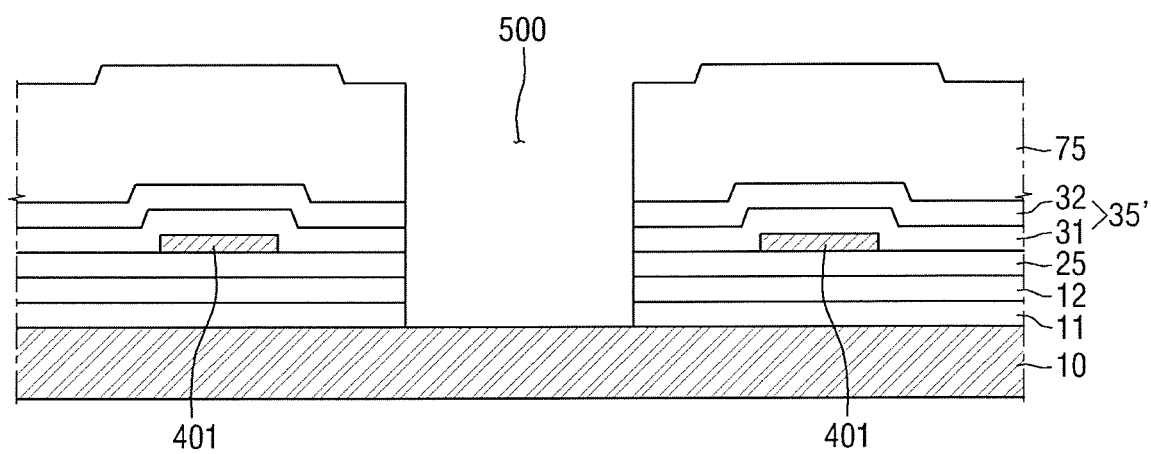
FIG. 17 is a cross-sectional view of an array substrate according to a modified example of the embodiment of FIG. 6.
Figure 18:
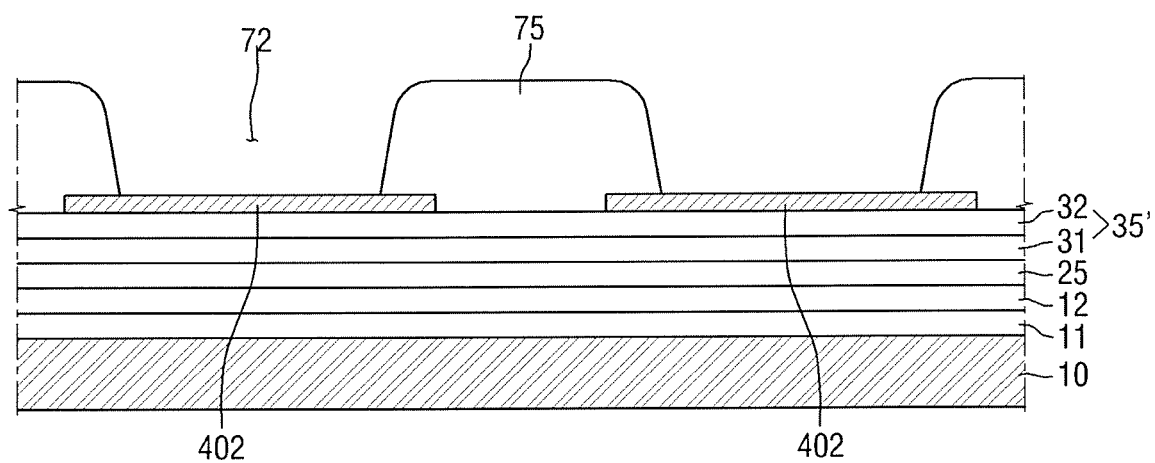
FIG. 18 is a cross-sectional view of an array substrate according to a modified example of the embodiment of FIG. 7.

FIG. 17 is a cross-sectional view of an array substrate according to a modified example of the embodiment of FIG. 6. FIG. 18 is a cross-sectional view of an array substrate according to a modified example of the embodiment of FIG. 7.

The modified example of FIGS. 17 and 18 is different from the array substrate of FIGS. 6 and 7 in that a second insulating layer 35' includes a first sub-insulating layer 31 and a second sub-insulating layer 32.

As described above, the second insulating layer 35 may have a single layer structure but exemplary embodiments of the present invention are not limited thereto. For example, in the present exemplary embodiment, the second insulating layer 35' may have a multilayer structure including two or more insulating layers. For ease of description, an insulating layer which covers a first insulating layer 25 will be referred to as the first sub-insulating layer 31, and an insulating layer which covers the first sub-insulating layer 31 will be referred to as the second sub-insulating layer 32.

Each of the first sub-insulating layer 31 and the second sub-insulating layer 32 may be, for example, an inorganic insulating layer formed of an inorganic material. For example, each of the first sub-insulating layer 31 and the second sub-insulating layer 32 may include one or more materials selected from silicon oxide and silicon nitride. However, the material of each of the first sub-insulating layer 31 and the second sub-insulating layer 32 are not limited to the above examples. The first sub-insulating layer 31 and the second sub-insulating layer 32 may be formed of, for example, different materials.

The second insulating layer 35' may have a multilayer structure due to the structure of a display area DA. For example, although not shown in the drawings, a storage capacitor may be disposed adjacent to a TFT in the display area DA. In an exemplary embodiment, the storage capacitor may include, for example, a first gate metal disposed on a gate insulating layer 20, a first sub-insulating layer 31 disposed on the first gate metal, a second sub-insulating layer 32 disposed on the first sub-insulating layer 31, and a second gate metal disposed on the second sub-insulating layer 32. To correspond to the storage capacitor, source and drain electrodes 61 and 62 of the TFT may be disposed on the second sub-insulating layer 32. However, this is merely an example, and the specific structure of the display area DA is not limited to this example.

Figure 19:
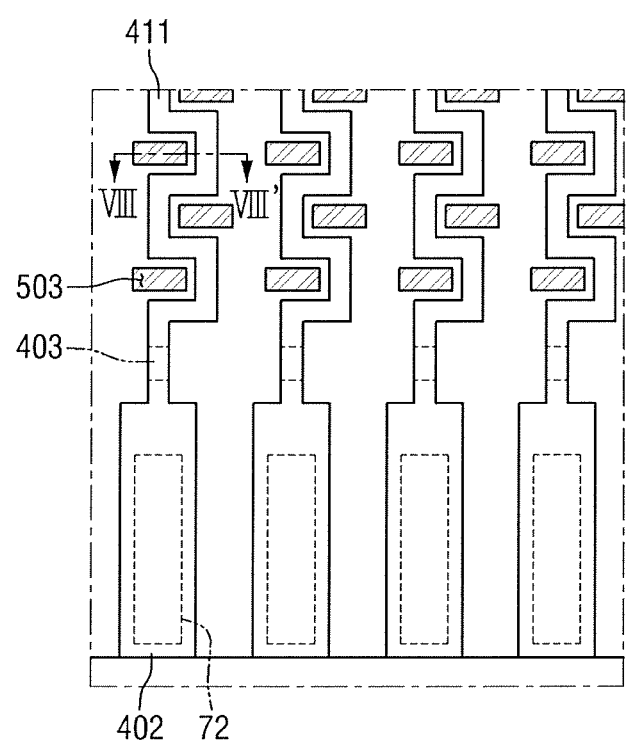
FIG. 19 is a partial enlarged view of an array substrate according to an embodiment of the present invention.
Figure 20:
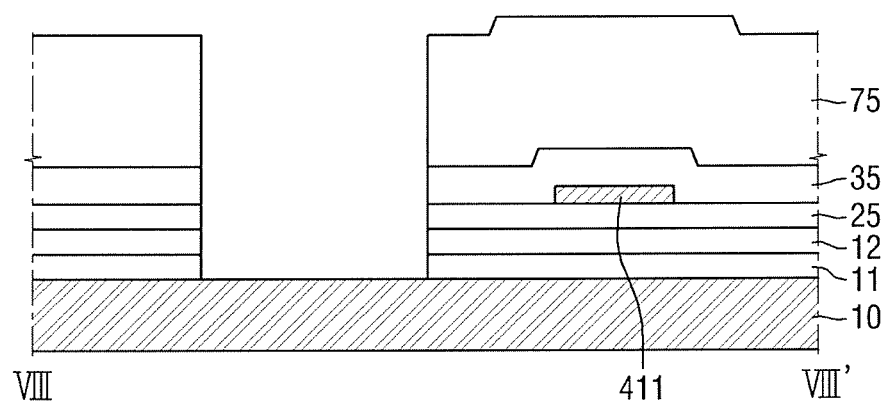
FIG. 20 is a cross-sectional view taken along the line VIII-VIII' of FIG. 19.

FIG. 19 is a partial enlarged view of an array substrate according to an embodiment of the present invention. FIG. 20 is a cross-sectional view taken along the line VIII-VIII' of FIG. 19.

Referring to FIGS. 19 and 20, the array substrate according to the current embodiment is different from the array substrate 100 according to FIG. 4 in that each wiring line 411 extends in a zigzag shape toward a side of a substrate 10.

Each wiring line 411 may be bent, for example, one or more times. In an exemplary embodiment, each wiring line 411 may have, for example, a zigzag shape and extend toward a side of the substrate 10. For ease of description, a direction toward the side of the substrate 10 will be referred to as a first direction, a direction perpendicular to the first direction will be referred to as a second direction, and a direction opposite the second direction will be referred to as a third direction.

Referring to FIG. 19, each wiring line 411 extending in the first direction may extend, for example, a predetermined distance in the second direction, extend a predetermined distance again in the first direction, extend a predetermined distance in the third direction, and then extend again in the first direction. That is, each wiring line 411 may extend in the first direction, the second direction, the first direction, the third direction and the first direction, sequentially.

In an exemplary embodiment, the distance by which each wiring line 411 extends along the second direction may be, but is not limited to, substantially equal to the distance by which the wiring line 411 extends along the third direction.

As described above, each wiring line 411 may extend in the first direction, the second direction, the first direction, the third direction and the first direction sequentially, and this order may be repeated one or more times.

When each wiring line 411 extends in the first direction, the second direction, the first direction, the third direction and the first direction sequentially as described above, a space may be defined by each portion of the wiring line 411 which extends in the second direction, the first direction and the third direction or in the third direction, the first direction and the second direction. In an exemplary embodiment, a recess pattern 503 may be disposed, for example, in the space defined by each portion of the wiring line 411 which extends in the second direction, the first direction and the third direction or in the third direction, the first direction and the second direction. In other words, the wiring line 411 is disposed adjacent to an outer circumference of each recess pattern 503 and disposed along part of the outer circumference of the recess pattern 503. To put it another way, the recess pattern 503 may be disposed between portions of each wiring line 411 which extends in a zigzag shape. That is, at least one recess pattern 503 may be disposed between the wiring lines 411.

For example, from the perspective of the recess pattern 503, a plurality of recess patterns 503 may be arranged in a matrix of columns and rows, and each wiring line 411 may extend in a zigzag shape between the recess patterns 503 arranged in the matrix of columns and rows. In FIG. 19, a plurality of recess patterns 503 are arranged in a straight line along a row direction and alternately arranged along a column direction. However, the arrangement of the recess patterns 503 is not limited to this example. That is, the recess patterns 503 may also be arranged in a straight line along the row and column directions, may be alternately arranged along the row direction and arranged in a straight line along the column direction, or may be alternately arranged along the column direction and arranged in a straight line along the row direction.

In addition, each wiring line 411 may be disposed, for example, between the recess patterns 503 arranged in the matrix. At least one recess pattern 503 may be disposed, for example, between a wiring line 411 and another wiring line 411.

Figure 21:
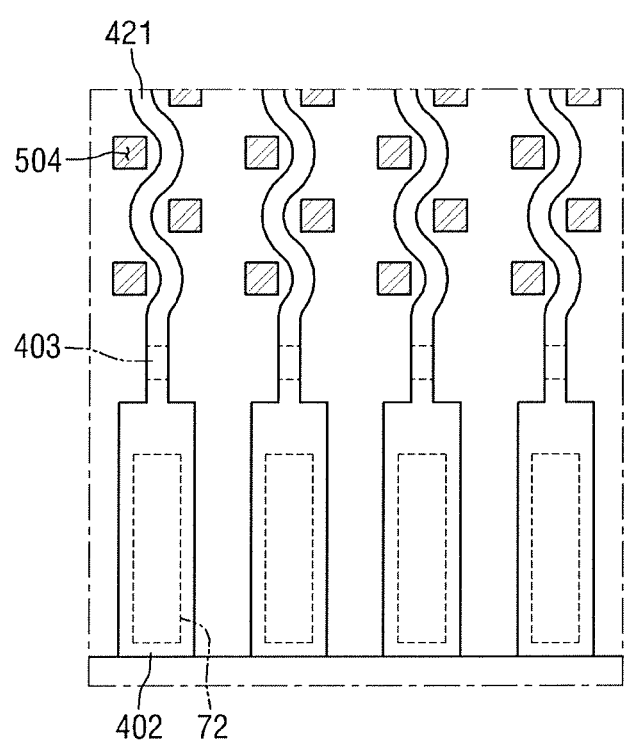
FIG. 21 is a partial enlarged view of an array substrate according to an embodiment of the present invention.

FIG. 21 is a partial enlarged view of an array substrate according to an embodiment of the present invention. Referring to FIG. 21, the array substrate according to the current embodiment is different from the array substrate 100 according to FIG. 4 in that each wiring line 421 extends in a curved shape having a pitch.

In the array substrate according to the current embodiment, each wring line 421 may extend, for example, in a curved shape having a pitch. In other words, each wiring line 421 may have a winding shape. To put it another way, each wiring line 421 may wind in a gentle curved shape.

When each wiring line 421 extends in a curved shape having a pitch, valleys and ridges may be formed on both sides of the wiring line 421. That is, a valley and a ridge may be repeated one or more times on a side of each wiring line 421 and may also be repeated one or more times on the other side of the wiring line 421.

A recess pattern 504 may be disposed adjacent to each valley of each wiring line 421. At least one recess pattern 504 may be disposed adjacent to each of the valleys formed on both sides of each wiring line 421. In FIG. 21, the recess pattern 504 is adjacent to each valley. However, exemplary embodiments of the present invention are not limited thereto, and the recess pattern 504 may partially contact each valley of each wiring line 421.

For example, from the perspective of the recess pattern 504, a plurality of recess patterns 504 may be arranged in a matrix of columns and rows, and each wiring line 421 may extend in a curved shape having a pitch between the recess patterns 504 arranged in the matrix of columns and rows.

In FIG. 21, a plurality of recess patterns 504 are arranged in a straight line along a row direction and alternately arranged along a column direction. However, the arrangement of the recess patterns 504 is not limited to this example. That is, the recess patterns 504 may also be arranged in a straight line along the row and column directions, may be alternately arranged along the row direction and arranged in a straight line along the column direction, or may be alternately arranged along the column direction and arranged in a straight line along the row direction.

In addition, each wiring line 421 may be disposed, for example, between the recess patterns 504 arranged in the matrix. At least one recess pattern 504 may be disposed, for example, between a wiring line 421 and another wiring line 421.

Figure 22:
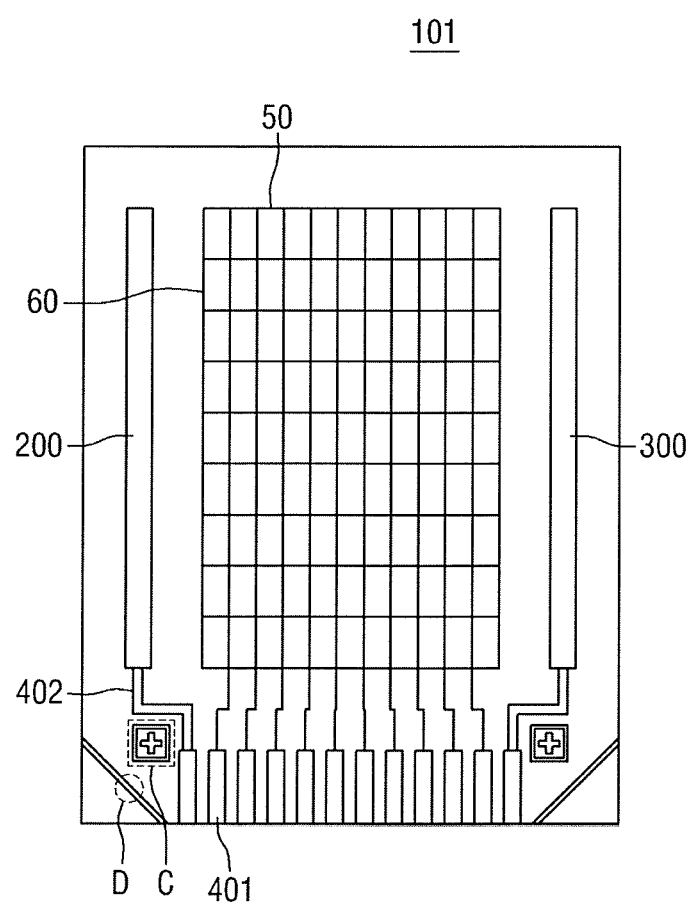
FIG. 22 is a plan view of an array substrate according to an embodiment of the present invention.
Figure 23:
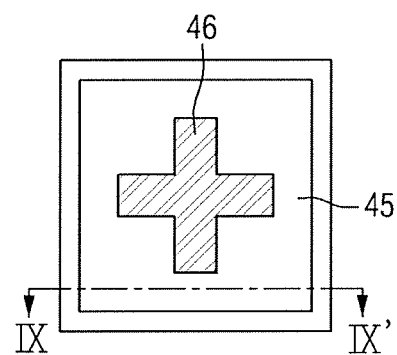
FIG. 23 is a partial enlarged view of a portion 'C' of FIG. 22.
Figure 24:
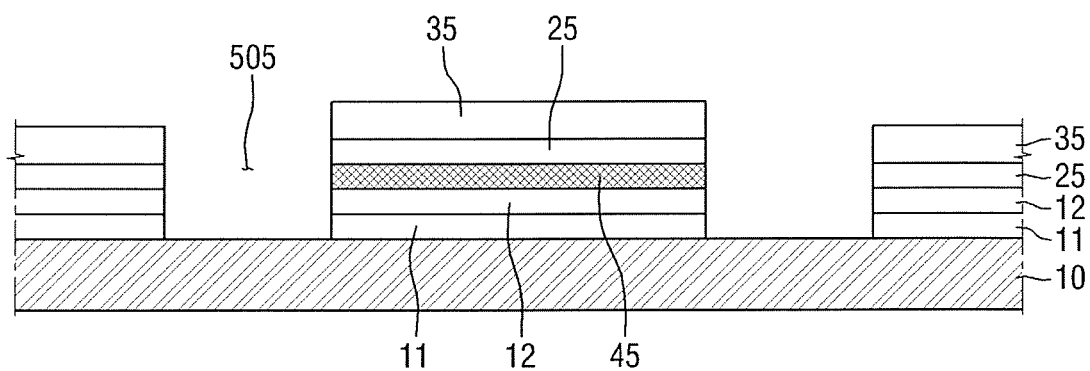
FIG. 24 is a cross-sectional view taken along the line IX-IX' of FIG. 23.
Figure 25:
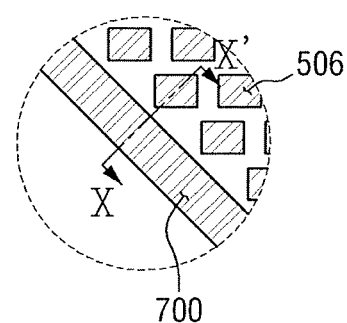
FIG. 25 is a partial enlarged view of a portion 'D' of FIG. 22.
Figure 26:
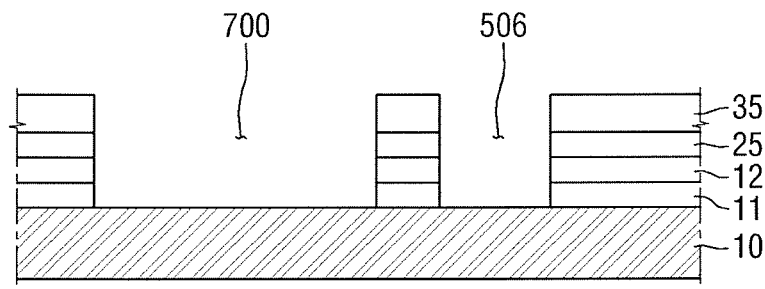
FIG. 26 is a cross-sectional view taken along the line X-X' of FIG. 25.

FIG. 22 is a plan view of an array substrate according to an embodiment of the present invention. FIG. 23 is a partial enlarged view of a portion 'C' of FIG. 22. FIG. 24 is a cross-sectional view taken along the line IX-IX' of FIG. 23. FIG. 25 is a partial enlarged view of a portion 'D' of FIG. 22. FIG. 26 is a cross-sectional view taken along the line X-X' of FIG. 25.

Referring to FIGS. 22 through 25, the array substrate according to the current embodiment is different from the array substrate 100 according to FIG. 1 in that a cell ID pattern 45 and/or a cutting line 700 are formed in a non-display area NDA.

The array substrate 101 according to the current embodiment may include, for example, the cell ID pattern 45 and the cutting line 700.

The cell ID pattern 45 may be disposed, for example, in the non-display area NDA. In an exemplary embodiment, the cell ID pattern 45 may be disposed, for example, outside each of outermost wiring lines 401 among a plurality of wiring lines 401. That is, the cell ID pattern 45 may be disposed adjacent to each of the outermost wiring lines 401. A unique number, a figure, an identification code, etc. used to identify the array substrate 101 may be patterned on the cell ID pattern 45. That is, information about the array substrate 101 can be obtained from the unique number, the figure, the identification code, etc. patterned on the cell ID pattern 45.

The cell ID pattern 45 will now be described in greater detail with reference to FIGS. 23 and 24.

In FIGS. 23 and 24, the cell ID pattern 45 is shaped like a quadrangle. However, the shape of the cell ID pattern is not limited to the quadrangular shape, and the cell ID pattern 45 may also have a circular shape or a shape that at least partially includes a curve.

As described above, a unique number, a figure, an identification code, etc. may be patterned on the cell ID pattern 45. In FIG. 23, a cross-shaped FIG. 46 is patterned on the cell ID pattern 45. However, the shape of the figure formed on the cell ID pattern 45 is not limited to the cross shape.

In an exemplary embodiment, the cell ID pattern 45 may be disposed on a buffer layer 12. However, this is merely an example, and the position of the cell ID pattern 45 is not limited to this example. The cell ID pattern 45 disposed on the buffer layer 12 may be formed of, for example, substantially the same material as a semiconductor layer 40 of a display area DA. That is, the cell ID pattern 45 of the non-display area NDA may be formed at the same time as the semiconductor layer 40 of the display area DA. However, exemplary embodiments of the present invention are not limited thereto, and the cell ID pattern 45 may also be formed independently of the semiconductor layer 40 of the display area DA.

A recess pattern 505 may be disposed along an outer circumference of the cell ID pattern 45. The recess pattern 505 may contact the outer circumference of the cell ID pattern 45 or may be disposed adjacent to the outer circumference of the cell ID pattern 45. In an exemplary embodiment in which the cell ID pattern 45 is shaped like a quadrangle, the recess pattern 505 may be shaped like a quadrangle having a through hole. However, the shape of the cell ID pattern 45 is not limited to the above example, and the recess pattern 505 may have a shape corresponding to the shape of the outer circumference of the cell ID pattern 45. The recess pattern 505 disposed along the outer circumference of the cell ID pattern 45 can prevent cracks created during a process of manufacturing or transporting the array substrate 101 from propagating to the cell ID pattern 45 and thus damaging the cell ID pattern 45.

The cutting line 700 may be formed, for example, in the non-display area NDA of the array substrate according to the current embodiment. A corner of the non-display area NDA of the array substrate 101 may be cut according to the type of product. That is, the corner of the array substrate 101 may be, for example, chamfered.

To this end, the cutting line 700 may be formed on the array substrate 101. In an exemplary embodiment, the cutting line 700 may, for example, extend diagonally in both sides of the non-display area NDA of the array substrate. That is, the cutting line 700 may traverse at least part of the array substrate 101.

An angle formed by the cutting line 700 and a side of the array substrate 101 is not limited to a particular angle. That is, the angle formed by the cutting line 700 and the side of the array substrate 101 may vary according to a product to which the array substrate 101 is applied.

To prevent the creation of cracks in a cutting process, the cutting line 700 may be, for example, recessed from a top surface of a second insulating layer 35 by a predetermined distance. That is, as shown in the cross-sectional view of FIG. 26, the cutting line 700 may be recessed from the top surface of the second insulating layer 35 to expose a top surface of a substrate 10. In other words, a bottom surface of the cutting line 700 may include, for example, the top surface of the substrate 10, and sidewalls of the cutting line 700 may include inner side surfaces of a barrier layer 11, the buffer layer 12, a first insulating layer 25 and the second insulating layer 35.

Referring to FIGS. 25 and 26, one or more recess patterns 506 may be disposed, for example, adjacent to the cutting line 700. For example, the recess patterns 506 may be disposed adjacent to a second side of the cutting line 700. In other words, when the array substrate 101 is cut along the cutting line 700 in a cutting process, a first side of the cutting line 700 may be removed, and the second side of the cutting line 700 may be left unremoved. The recess patterns 506 may be disposed adjacent to the second side of the cutting line 700. The recess patterns 506 may be arranged in column and row directions. However, exemplary embodiments of the present invention are not limited thereto, and the recess patterns 506 may be arranged regularly or irregularly.

When the first side of the cutting line 700 is cut in the cutting process, the second side of the cutting line 700 may become vulnerable to impact. In this case, impacts applied to the second side of the cutting line 700 may create cracks, and the cracks may grow and propagate to the display area DA. Here, the recess patterns 506 disposed adjacent to the second side of the cutting line 700 can serve as a crack stopper. That is, the propagation of the cracks can be suppressed by the recess patterns 506.

Figure 27:
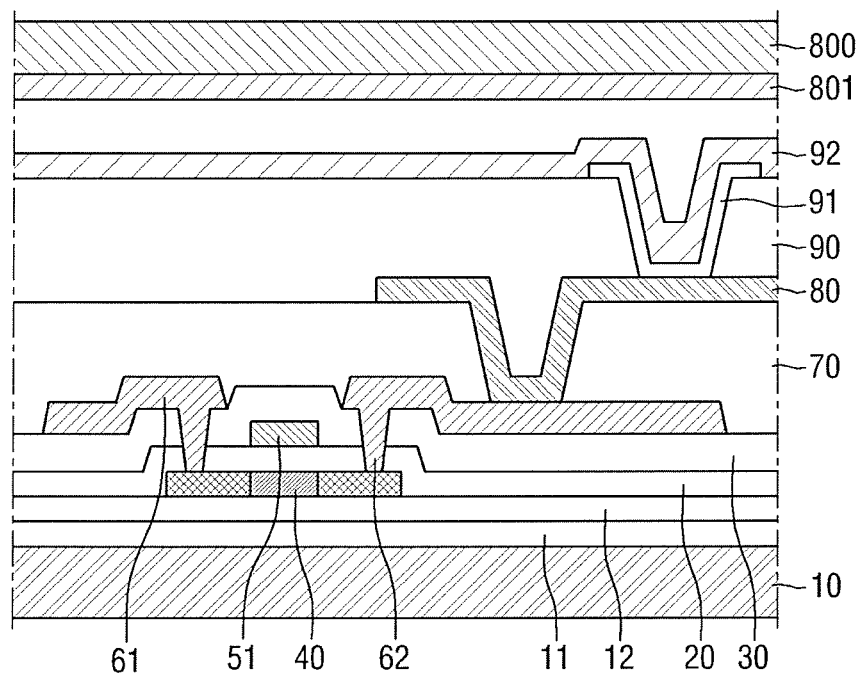
FIG. 27 is a cross-sectional view of an organic light-emitting display (OLED) according to an embodiment of the present invention.

FIG. 27 is a cross-sectional view of an organic light-emitting display (OLED) according to an embodiment of the present invention.

Referring to FIG. 27, the OLED according to the current embodiment includes, for example, an array substrate and an encapsulation member. The array substrate has a display area DA and a non-display area NDA located outside the display area DA. The non-display area NDA includes, for example, a substrate 10, a barrier layer 11 which is disposed on the substrate 10, a buffer layer 12 which is disposed on the barrier layer 11, a first insulating layer 25 which is disposed on the buffer layer 12, a second insulating layer 35 which is disposed on the first insulating layer 25, and a plurality of wiring patterns. The wiring patterns are disposed between the first insulating layer 25 and the second insulating layer 35 and on the second insulating layer 35. In addition, the wiring patterns are separated from each other and extend toward a side of the substrate 10. The non-display area NDA further includes a recess pattern which is recessed from a top surface of the second insulating layer 35 by a predetermined depth to expose at least part of a top surface of the substrate 10, and an organic insulating layer 75 which is disposed on the second insulating layer 35 and exposes at least part of a portion of the top surface of the substrate 10 which is exposed by the recess pattern.

For ease of description, only one unit pixel area is illustrated in FIG. 27. However, the OLED according to the current embodiment is not limited to the one unit pixel area. That is, the OLED according to the current embodiment may include a plurality of unit pixel areas as described above in relation to the array substrates 100 according to FIGS. 1-21 or in relation to the array substrates 101 according to FIGS. 22-26.

The display area DA of the array substrate in the OLED according to the current embodiment will first be described.

The substrate 10 may be, for example, a plate-shaped member and may support other elements which will be described later. The substrate 10 may be, for example, an insulating substrate and may be formed of a polymer material including glass, quartz, or plastic. In an exemplary embodiment, the substrate 10 may be formed of, for example, polyimide. However, the material of the substrate 10 is not limited to polyimide. For example, in an exemplary embodiment, the substrate 10 may include polyethersulfone (PES), polyethylenenaphthalate (PEN), polyethylene (PE), polyvinyl chloride (PVC), polyethylene terephthalate (PET), or combinations thereof.

The substrate 10 may be, for example, a rigid substrate. However, the substrate 10 is not limited to the rigid substrate and may also be a ductile or flexible substrate. That is, in the present specification, the term "substrate" can be understood as a concept that encompasses, for example, a bendable, foldable, and rollable flexible substrate.

As shown in FIG. 27, the substrate 10 may have a single layer structure. However, the structure of the substrate 10 is not limited to the single layer structure. That is, alternatively in an exemplary embodiment, the substrate 10 may have a stacked structure of two or more layers. In other words, the substrate 10 may include, for example, a base layer and a protective layer disposed on the base layer.

The base layer may be formed of, for example, an insulating material. In an exemplary embodiment, the base layer may be formed of, for example, polyimide. However, the material of the base layer is not limited to polyimide. The protective layer may be disposed on the base layer. The protective layer may be formed of, for example, an organic material. For example, the protective layer may include one or more materials selected from polyethylene terephthalate and polyethylene naphthalate. However, the material of the protective layer is not limited to the above examples.

A barrier layer 11 may be disposed on the substrate 10. The barrier layer 11 may prevent penetration of impurity elements from the substrate 10 and planarize a surface of the substrate 10. In an exemplary embodiment, the barrier layer 11 may be formed of, for example, silicon oxide or silicon nitride. However, the material of the barrier layer 11 is not limited to the above examples. Alternatively, in an exemplary embodiment, the barrier layer 11 can be omitted depending on the material of the substrate 10 or process conditions.

A buffer layer 12 may be formed on the barrier layer 11 to cover the barrier layer 11. The buffer layer 12 may be, for example, an inorganic layer formed of an inorganic material. In an exemplary embodiment, the buffer layer 12 may be formed of, for example, one or more materials selected from the group consisting of silicon oxide (SiOx), silicon nitride (SiNx), aluminum oxide (AlOx), and silicon oxynitride (SiON). However, the material of the buffer layer 12 is not limited to the above examples. In addition, the buffer layer 12 may have a single layer structure or a stacked structure of two or more layers. In an exemplary embodiment in which the buffer layer 12 consists of two layers, the two layers may be formed of, for example, different materials. For example, a first layer may be formed of silicon oxide, and a second layer may be formed of silicon nitride. However, the structure of the buffer layer 12 is not limited to the above example.

A semiconductor layer 40 may be formed on the buffer layer 12. The semiconductor layer 40 may be formed of, for example, amorphous silicon or polycrystalline silicon. In an exemplary embodiment, the semiconductor layer 40 may be formed by, for example, coating, patterning, and then crystallizing amorphous silicon. However, a method of forming the semiconductor layer 40 is not limited to the above example. In the present specification, the term "semiconductor layer" can be understood as an oxide semiconductor layer, but exemplary embodiments of the present invention are not limited thereto.

A gate insulating layer 20 may be formed on the semiconductor layer 40. The gate insulating layer 20 may include, for example, silicon nitride or silicon oxide, but the material of the gate insulating layer 20 is not limited to the above examples. The gate insulating layer 20 may have a single layer structure. However, the structure of the gate insulating layer 20 is not limited to the single layer structure. The gate insulating layer 20 may also have a multilayer structure which includes two or more insulating layers with different physical properties.

A gate wiring including a gate line 50, a gate electrode 51 and a gate pad may be disposed on the gate insulating layer 20. The gate wiring may be formed of, for example, one or more materials selected from the group consisting of aluminum (Al)-based metal such as aluminum or an aluminum alloy, silver (Ag)-based metal such as silver or a silver alloy, copper (Cu)-based metal such as copper or a copper alloy, molybdenum (Mo)-based metal such as molybdenum or a molybdenum alloy, chromium (Cr), titanium (Ti), and tantalum (Ta). In addition, in an embodiment, the gate wiring may be formed of, for example, at least one material selected from the group consisting of, for example, nickel (Ni), gold (Au), palladium (Pd), platinum (Pt), neodymium (Nd), zinc (Zn), cobalt (Co), silver (Ag), manganese (Mn) or any alloys thereof. However, the material of the gate wiring is not limited to the above examples, and any transparent or semitransparent material having conductivity can be used to form the gate wiring.

The gate line 50 may be provided in a plurality as described above, and the gate lines 50 may extend in a direction to be parallel to each other.

An interlayer insulating film 30 may be disposed on the gate wiring to cover the gate wiring. The interlayer insulating film 30 may be, for example, an inorganic layer formed of an inorganic material. In an exemplary embodiment, the interlayer insulating film 30 may include, for example, silicon nitride or silicon oxide, but the material of the interlayer insulating film 30 is not limited to the above examples. The interlayer insulating film 30 may have a single layer structure. However, the structure of the interlayer insulating film 30 is not limited to the single layer structure. The interlayer insulating film 30 may also have a multilayer structure which includes two or more insulating layers with different physical properties. The interlayer insulating film 30 having the multilayer structure will be described later.

A data wiring including, for example, a source electrode 61, a drain electrode 62 and a data line 60 may be disposed on the interlayer insulating film 30. The data wiring may be formed of, for example, molybdenum, chromium, a refractory metal such as tantalum and titanium, or an alloy of these materials. In addition, in an embodiment, the data wiring may be formed of, for example, at least one material selected from the group consisting of, for example, nickel (Ni), gold (Au), palladium (Pd), platinum (Pt), neodymium (Nd), zinc (Zn), cobalt (Co), silver (Ag), manganese (Mn) or any alloys thereof. However, the material of the data wiring is not limited to the above examples, and any transparent or semitransparent material having conductivity can be used to form the data wiring.

The data line 60 may deliver a data signal and may be placed to intersect the gate line 50. That is, in an exemplary embodiment, the gate line 50 may extend, for example, in a horizontal direction, and the data line 60 may extend in a vertical direction to intersect the gate line 50.

In an exemplary embodiment, the data line 60 and the gate line 50 may be, for example, bent.

The source electrode 61 may be, for example, a portion of the data line 60 and may lie in the same plane with the data line 60. The drain electrode 62 may, for example, extend parallel to the source electrode 61. In this case, the drain electrode 62 may be, for example, parallel to the portion of the data line 60.

The gate electrode 51, the source electrode 61 and the drain electrode 62 form one TFT, together with the semiconductor layer 40. A channel of the TFT may be formed in the semiconductor layer 40 between the source electrode 61 and the drain electrode 62.

A planarization layer 70 may be disposed on the data wiring to cover the data wiring and the interlayer insulating film 30. The planarization layer 70 may be, for example, relatively thicker than the interlayer insulating film 30. Due to this difference in the thicknesses of the planarization layer 70 and the interlayer insulating film 30, a top surface of the planarization layer 70 may be relatively flatter than a bottom surface thereof which contacts the interlayer insulating film 30 and the source and drain electrodes 61 and 62.

A first contact hole may be formed in the planarization layer 70 to expose at least part of the drain electrode 62. For example, the first contact hole may penetrate through the planarization layer 70 and partially expose a top surface of the drain electrode 62.

A first electrode 80 may be disposed on the planarization layer 70 and an exposed portion of the drain electrode 62. That is, the first electrode 80 may cover the planarization layer 70, sidewalls of the first contact hole, and the top surface of the drain electrode 62. Accordingly, the first electrode 80 and the drain electrode 62 may be electrically connected to each other. In an exemplary embodiment, the first electrode 80 may be, but is not limited to, an anode. The first electrode 80 may be formed of, for example, indium tin oxide, indium zinc oxide, cadmium tin oxide (CTO), aluminum zinc oxide (AZO), indium tin zinc oxide (ITZO), cadmium oxide (CdO), hafnium oxide (HfO), indium gallium zinc oxide (InCaZnO), indium gallium zinc magnesium oxide (InGaZnMgO), indium gallium magnesium oxide (InGaMgO) or indium gallium aluminum oxide (InGaAlO). However, the material of the first electrode 80 is not limited to the above examples.

A pixel defining layer 90 may be disposed on the first electrode 80. The pixel defining layer 90 may expose at least part of the first electrode 80. The pixel defining layer 90 may be formed of, for example, one or more organic materials selected from benzocyclobutene, polyimide, polyamide (PA), acrylic resin, and phenolic resin. Alternatively, the pixel defining layer 90 may be formed of, for example, an inorganic material such as silicon nitride. The pixel defining layer 90 may also be formed of, for example, a photosensitizer containing black pigments. In this case, the pixel defining layer 90 may serve as a light-blocking member.

An organic layer 91 may be disposed on a portion of the first electrode 80 which is exposed by the pixel defining layer 90. The organic layer 91 may include, for example, organic material layers included in an OLED, that is, an organic light-emitting layer (EML), a hole injection layer (HIL), a hole transport layer (HTL), an electron injection layer (EIL), and an electron transport layer (ETL). The organic layer 91 may have a single layer structure including one of the organic material layers or a multilayer structure including two or more of the organic material layers.

A second electrode 92 may be formed on the organic layer 91. The second electrode 92 may cover the pixel defining layer 90 and the organic layer 91. In an exemplary embodiment, the second electrode 92 may be, but is not limited to, a whole-surface electrode which covers the pixel defining layer 90 and the organic layer 91. In an exemplary embodiment, the second electrode 92 may be, for example, a cathode.

The second electrode 92 may be formed of, for example, indium tin oxide, indium zinc oxide, cadmium tin oxide (CTO), aluminum zinc oxide (AZO), indium tin zinc oxide (ITZO), cadmium oxide (CdO), hafnium oxide (HfO), indium gallium zinc oxide (InGaZnO), indium gallium zinc magnesium oxide (InGaZnMgO), indium gallium magnesium oxide (InGaMgO) or indium gallium aluminum oxide (InGaAlO), but the material of the second electrode 92 is not limited to the above examples.

The non-display area NDA of the array substrate may be substantially identical to the non-display area NDA of any one of the array substrates 100 according to FIGS. 1-21 or to any one of the array substrates 101 according to FIGS. 22-26.

The encapsulation member may be disposed on the array substrate. In the present specification, the encapsulation member may be an encapsulation layer 803 or an encapsulation substrate 800. In FIG. 27, a case where the encapsulation member is the encapsulation substrate 800 is illustrated. However, the encapsulation member is not limited to the encapsulation substrate 800. A case where the encapsulation member is the encapsulation layer 803 will be described later with reference to FIG. 28. In an exemplary embodiment, the encapsulation substrate 800 may be attached to the array substrate with, for example, an encapsulant (not shown).

To attach the encapsulation substrate 800 to the array substrate, the encapsulant may be, for example, at least one of an epoxy adhesive, a UV-curing adhesive, frit, and their equivalents. However, the material of the encapsulant is not limited to the above examples.

The encapsulation substrate 800 may be attached and coupled to the array substrate with the above-described encapsulant. In an exemplary embodiment, the encapsulation substrate 800 may be formed of, for example, any one of transparent glass, transparent plastic, transparent polymer, and their equivalents. However, the material of the encapsulation substrate 800 is not limited to the above examples.

A conductive layer 801 may be formed on a surface of the encapsulation substrate 800 which faces the array substrate. The conductive layer 801 may ground external static electricity that is introduced into the OLED through the encapsulation substrate 800.

Figure 28:
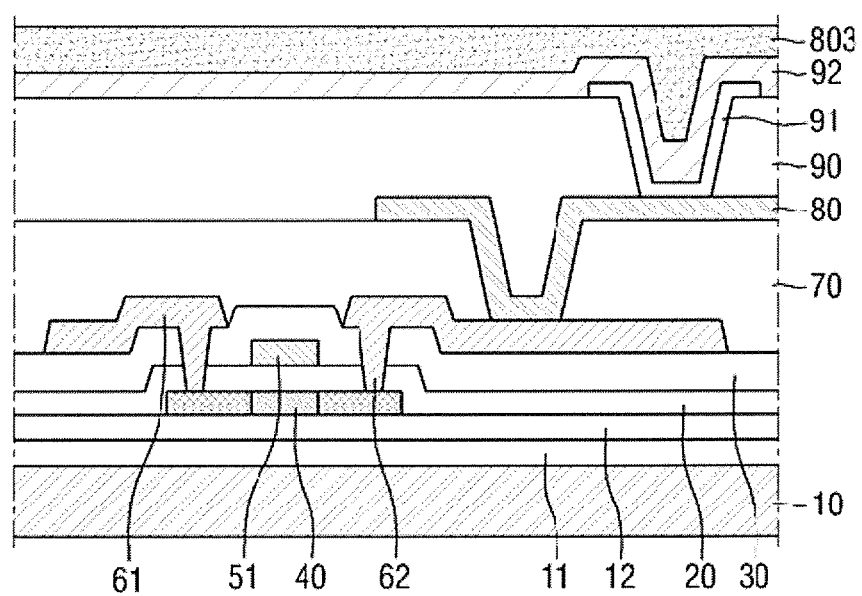
FIG. 28 is a cross-sectional view of an OLED according to an embodiment of the present invention.

FIG. 28 is a cross-sectional view of an OLED according to an embodiment of the present invention.

Referring to FIG. 28, the OLED according to the current embodiment is different from the OLED according to the embodiment of FIG. 27 in that the encapsulation member is the encapsulation layer 803.

As described above, in an exemplary embodiment, the encapsulation member may be the encapsulation layer 803. The encapsulation layer 803 may cover a display area DA and a non-display area NDA. In an exemplary embodiment, the encapsulation layer 803 may expose, for example, at least part of a wiring line 401 and/or a wiring pad 402. However, exemplary embodiments of the present invention are not limited thereto.

The encapsulation layer 803 may be formed of, for example, an organic material and/or an inorganic material.

Examples of the organic material used to form the encapsulation layer 803 may include, but are not limited to, epoxy, acrylate, and urethane acrylate. Examples of the inorganic material used to form the encapsulation layer 803 may include, but are not limited to, aluminum oxide and silicon oxide.

In FIG. 28, the encapsulation layer 803 has a single layer structure. However, the structure of the encapsulation layer 803 is not limited to the single layer structure. The encapsulation layer 803 may also have a stacked structure of one or more layers. In an exemplary embodiment, the encapsulation layer 803 may have a structure in which an organic layer and an inorganic layer are alternately stacked at least once. However, this is merely an example, and the structure of the encapsulation layer 803 is not limited to this example.

Embodiments of the present invention provide at least one of the following benefits.

That is, it is possible to prevent cracks from being created in an array substrate by external impacts.

In addition, it is possible to suppress the growth or propagation of cracks created by external impacts.

However, the effects of exemplary embodiments of the present invention are not restricted to the ones set forth herein, as would be apparent one of ordinary skill in the art referencing the present disclosure set forth herein.

Having described exemplary embodiments of the present invention, it is further noted that it is readily apparent to those of ordinary skill in the art that various modifications may be made without departing from the spirit and scope of the invention which is defined by the metes and bounds of the appended claims.

What is claimed is:

1. An array substrate, comprising:
a substrate including a display area and a non-display area adjacent to the display area;
a plurality of pixels disposed in the display area;
a first insulating layer disposed on the substrate;
a semiconductor layer disposed on a top surface of the first insulating layer;
a second insulating layer disposed on the semiconductor layer;
a plurality of wires extended toward a side of the substrate and electrically connected to each of the plurality of pixels;
a recess pattern that penetrates the first insulating layer to expose a top surface of the substrate in the non-display area; and
a top insulating layer disposed on the plurality of wires and in direct contact with the top surface of the substrate exposed by the recess pattern,
wherein the top insulating layer is positioned in the non-display area and the display area, and completely covers the recess pattern, and
wherein a portion of the top insulating layer in direct contact with the top surface of the substrate includes a same material as a portion of the top insulating layer in the display area.

2. The array substrate of claim 1, wherein the top insulating layer covers the portion of the top surface of the substrate which is exposed by the recess pattern.

3. The array substrate of claim 1, wherein the substrate comprises at least one polyimide layer.

4. The array substrate of claim 1, wherein the first insulating layer comprises a buffer layer,
wherein the recess pattern at least partially exposes the buffer layer, and
wherein the top insulating layer directly contacts the buffer layer.

5. The array substrate of claim 1, wherein the substrate comprises stacked layers including at least one base layer and at least one protective layer,
wherein the base layer includes a polyimide material, and
wherein the protective layer includes an organic material or an inorganic material.

6. The array substrate of claim 1, wherein the top insulating layer comprises an organic layer.

7. The array substrate of claim 6, wherein a top surface of the top insulating layer has a first height with respect to the top surface of the substrate in the display area and a second height with respect to the top surface of the substrate in a portion overlapping the recess pattern, and
wherein the first height is greater than the second height.

8. The array substrate of claim 1, wherein a side wall of the recess pattern comprises an inner side surface of the first insulating layer.

9. The array substrate of claim 8, wherein the side wall of the recess pattern is in direct contact with the top insulating layer.

10. The array substrate of claim 8, wherein the recess pattern further penetrates the second insulating layer, and
wherein the side wall of the recess pattern further comprises an inner side surface of the second insulating layer.

11. The array substrate of claim 1, wherein the top insulating layer covers the plurality of wires in the non-display area.

12. The array substrate of claim 1, wherein a top surface of the top insulating layer within the recess pattern is not planar.

13. The array substrate of claim 1, wherein a top surface of the top insulating layer includes a dip within the recess pattern and includes a pair of bumps overlapping the plurality of wires in a cross-sectional view.

14. An arm substrate, comprising:
a substrate including a display area and a non-display area adjacent to the display area;
a plurality of pixels disposed in the display area;
a first insulating layer disposed on the substrate;
a semiconductor layer disposed on a top surface of the first insulating layer;
a second insulating layer disposed on the semiconductor layer;
a plurality of wires extended toward a side of the substrate and electrically connected to each of the plurality of pixels;
a recess pattern that penetrates the first insulating layer to expose a top surface of the substrate in the non-display area; and
a top insulating layer disposed on the plurality of wires and in direct contact with the top surface of the substrate exposed by the recess pattern,
wherein each of the plurality of wires comprises:
a wiring line;
a wiring pad, wherein the wiring pad has an end overlapping at least part of the wiring line, and has another end wider than the wiring line; and
a wiring connection portion in which the wiring line and the wiring pad contact each other and are electrically connected to each other.

15. An array substrate, comprising:
a substrate including a display area and a non-display area adjacent to the display area;
a plurality of pixels disposed in the display area;
a first insulating layer disposed on the substrate;
a plurality of wires electrically connected to each of the plurality of pixels, the plurality of wires being disposed on the first insulating layer in the display area; and
a top insulating layer on the plurality of wires,
wherein an opening area of the first insulating layer in which the first insulating layer is not disposed to expose a top surface of the substrate is defined in the non-display area, and
wherein the top insulating layer is disposed in the opening area to be in direct contact with the top surface of the substrate,
wherein each of the plurality of wires comprises:
a wiring line;
a wiring pad, wherein the wiring pad has an end overlapping at least part of the wiring line, and has another end wider than the wiring line; and
a wiring connection portion in which the wiring line and the wiring pad contact each other and are electrically connected to each other.

16. The array substrate of claim 15, wherein the top insulating layer fills the opening area.

17. The array substrate of claim 15, wherein the top insulating layer directly contacts with an inner side surface of the first insulating layer in the opening area.

18. The array substrate of claim 15, wherein the top insulating layer covers the whole top surface of the substrate exposed in the opening area.

19. The array substrate of claim 15, wherein the substrate comprises at least one polyimide layer.

20. The array substrate of claim 15, wherein the substrate comprises stacked layers including at least one base layer and at least one protective layer,
wherein the base layer includes a polyimide material, and
wherein the protective layer includes an organic material or an inorganic material.

21. The array substrate of claim 15, wherein a top surface of the top insulating layer within the recess pattern is not planar.

* * * * *